(12) United States Patent
Finck et al.

(10) Patent No.: US 11,620,562 B2
(45) Date of Patent: Apr. 4, 2023

(54) DRIVING DARK MODES TO FACILITATE ENTANGLEMENT

(71) Applicant: International Business Machines Corporation, Armonk, NY (US)

(72) Inventors: Aaron Finck, White Plains, NY (US); John Blair, Katonah, NY (US); April Carniol, Ossining, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 38 days.

(21) Appl. No.: 17/409,425

(22) Filed: Aug. 23, 2021

(65) Prior Publication Data

US 2023/0053543 A1 Feb. 23, 2023

(51) Int. Cl.
*G06N 10/00* (2022.01)
*H03K 3/38* (2006.01)

(52) U.S. Cl.
CPC .............. *G06N 10/00* (2019.01); *H03K 3/38* (2013.01)

(58) Field of Classification Search
CPC .................................................. G06N 10/00
USPC ........................................................ 327/528
See application file for complete search history.

(56) References Cited

U.S. PATENT DOCUMENTS

| 9,425,804 | B2* | 8/2016 | McDermott, III | ..... G06N 10/00 |
| 9,858,531 | B1 | 1/2018 | Monroe et al. | |
| 10,282,675 | B2 | 5/2019 | Bloom et al. | |
| 10,290,916 | B2 | 5/2019 | Tobar et al. | |
| 2020/0327269 | A1 | 10/2020 | Pond et al. | |
| 2021/0384404 | A1 | 12/2021 | Finck et al. | |

FOREIGN PATENT DOCUMENTS

| WO | 2019173651 A1 | 9/2019 |
| WO | 2020106313 A1 | 5/2020 |

OTHER PUBLICATIONS

Rebic et al. | Giant-Kerr nonlinearities in Circuit-QED. Phys Rev Lett 103, Feb. 2, 2009, DOI:https://doi.org/10.1103/PhysRevLett.103.150503, 4 pages.

Gambetta, J.M. et al. | A superconducting qubit with Purcell protection and tunable coupling. Phys Rev Lett 106, 030502, Jan. 20, 2011, DOI: 10.1103/PhysRevLett.106.030502, 4 pages.

Srinivasan, S. J. et al | Tunable coupling in circuit quantum electrodynamics with a superconducting V-system. Phys Rev Lett 106, 083601, Feb. 22, 2011, DOI: 10.1103/PhysRevLett.106.083601, 4 pages.

(Continued)

*Primary Examiner* — Tomi Skibinski
(74) *Attorney, Agent, or Firm* — Amin, Turocy & Watson, LLP

(57) ABSTRACT

Systems and techniques that facilitate entanglement via driving dark modes are provided. In various embodiments, a method can comprise accessing a first multi-mode qubit and a second multi-mode qubit. In various cases, the first multi-mode qubit can be coupled to the second multi-mode qubit by a mode-selective coupler. In various aspects, the method can further comprise exciting a dark mode of the first multi-mode qubit. In various cases, the exciting the dark mode can entangle the first multi-mode qubit with the second multi-mode qubit.

20 Claims, 16 Drawing Sheets
(5 of 16 Drawing Sheet(s) Filed in Color)

(56) References Cited

OTHER PUBLICATIONS

Roy et al. | Implementation of pairwise longitudinal coupling in a multi-junction circuit. Phys Rev Applied 7, Published May 30, 2017, DOI:https://doi.org/10.1103/PhysRevApplied.7.054025, 16 pages.
Ficheux, Q. et al. | Fast logic with slow qubits: microwave-activated controlled-Z gate on low-frequency fluxoniums. Phys. Rev. X 11, 021026, arXiv:2011.02634v1 [quant-ph] Nov. 5, 2020, 17 pages.
Filipp, S. et al. | Multi-mode mediated exchange coupling in cavity QED. Phys. Rev. A 83, 063827, Nov. 2010, arXiv:1011.3732 [quant-ph], 10 pages.
Finck, A. et al. | "Quantum Device Facilitating Suppression of ZZ Interactions between Two-Junction Superconducting Qubits", U.S. Appl. No. 16/917,056, filed Jun. 30, 2020, 59 pages.
Appendix P—List of IBM Patents or Patent Applications Treated as Related.
International Search Report and Written Opinion received for PCT Application Serial No. PCT/EP2022/073249 dated Aug. 19, 2022, 14 pages.
Finck, A.D.K. et al. | "Suppressed crosstalk between two-junction superconducting qubits with mode-selective exchange coupling." arXiv:2105.11495v2 [quant-ph] Nov. 22, 2021, 5 pages.

\* cited by examiner

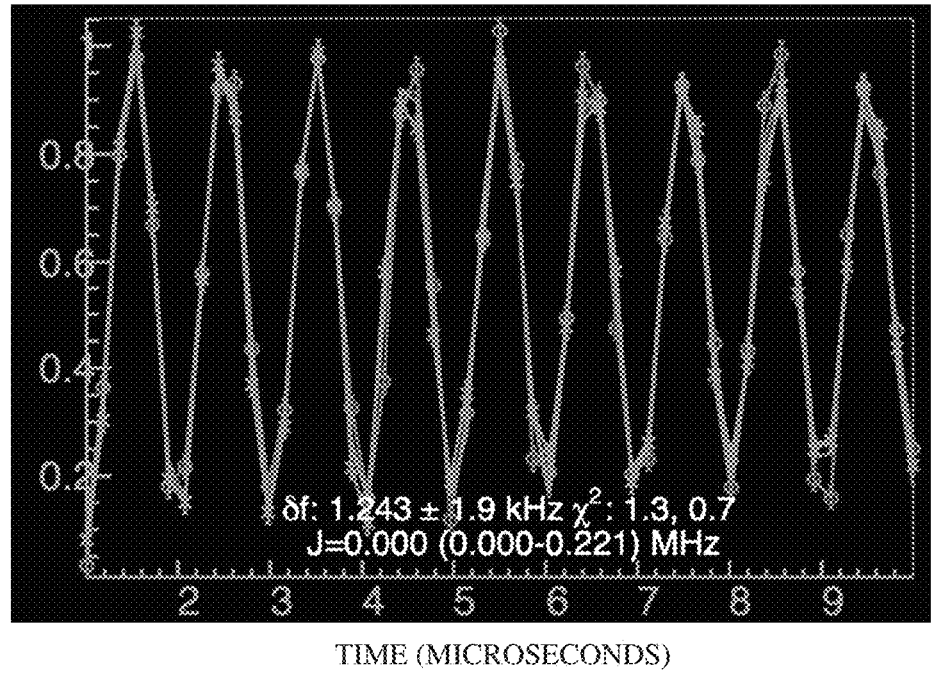
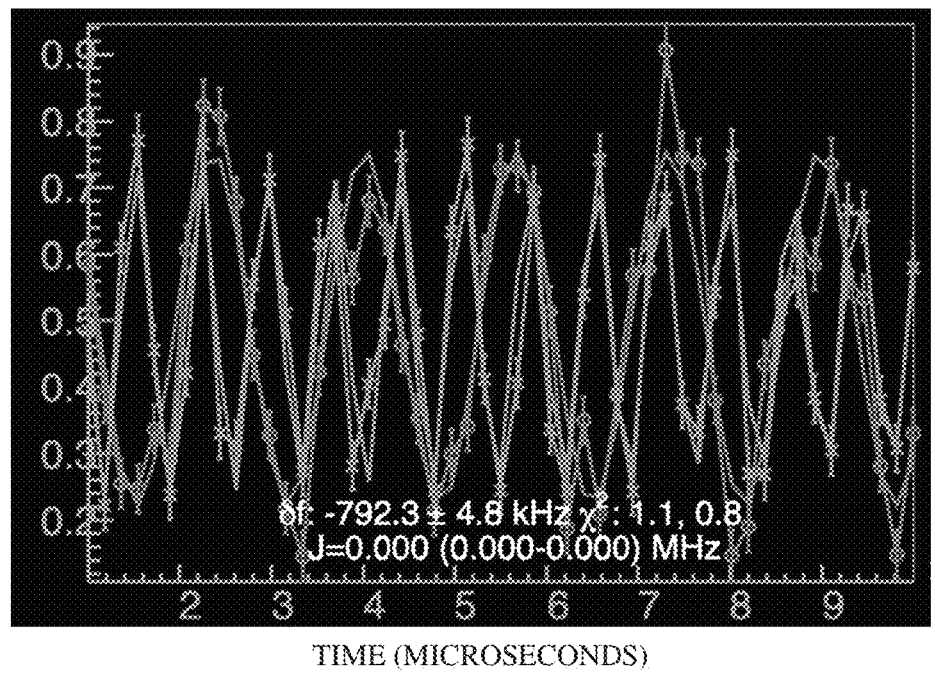
FIG. 5

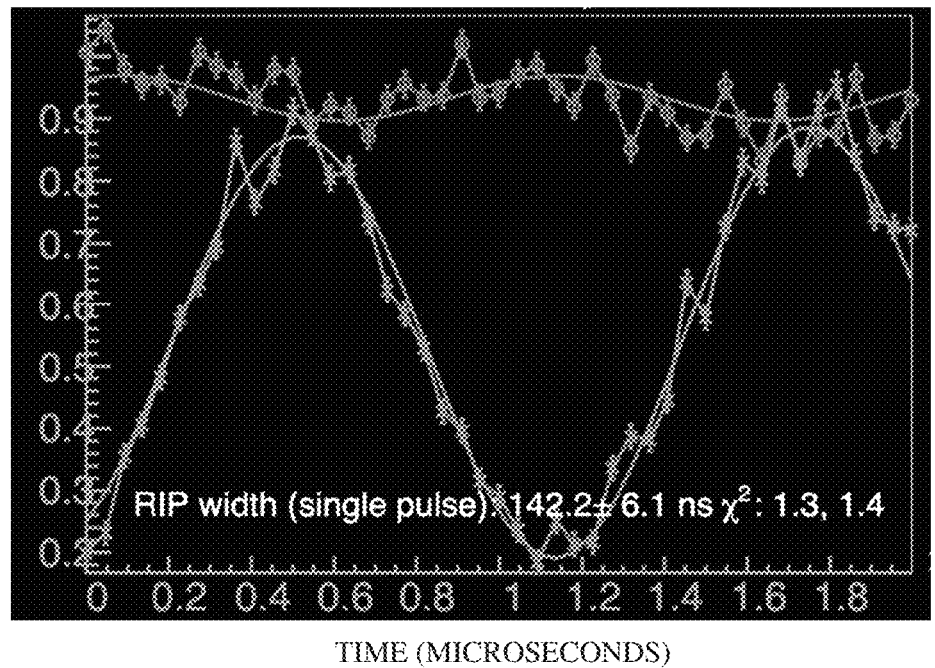
Z ROTATIONS OF DARK MODE OF CONTROL QUBIT IN RESPONSE TO APPLICATION OF DARK MODE EXCITATION PULSE SEQUENCE TO CONTROL QUBIT
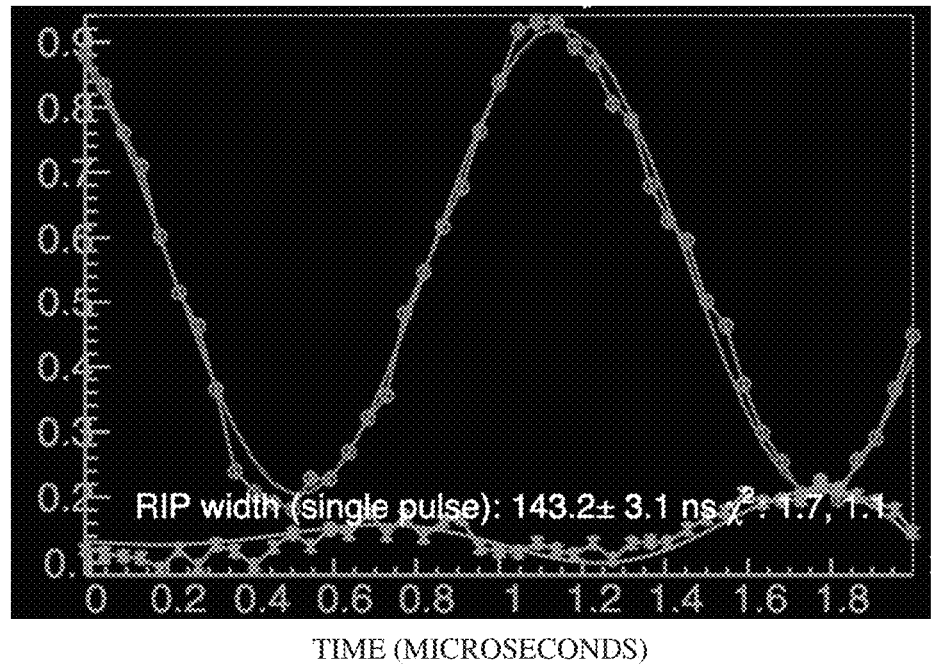
Z ROTATIONS OF BRIGHT MODE OF TARGET QUBIT IN RESPONSE TO APPLICATION OF DARK MODE EXCITATION PULSE SEQUENCE TO CONTROL QUBIT
FIG. 7

Z ROTATIONS OF BRIGHT MODE OF SPECTATOR QUBIT IN
RESPONSE TO APPLICATION OF DARK MODE EXCITATION
PULSE SEQUENCE TO CONTROL QUBIT, WITHOUT ECHO PULSE
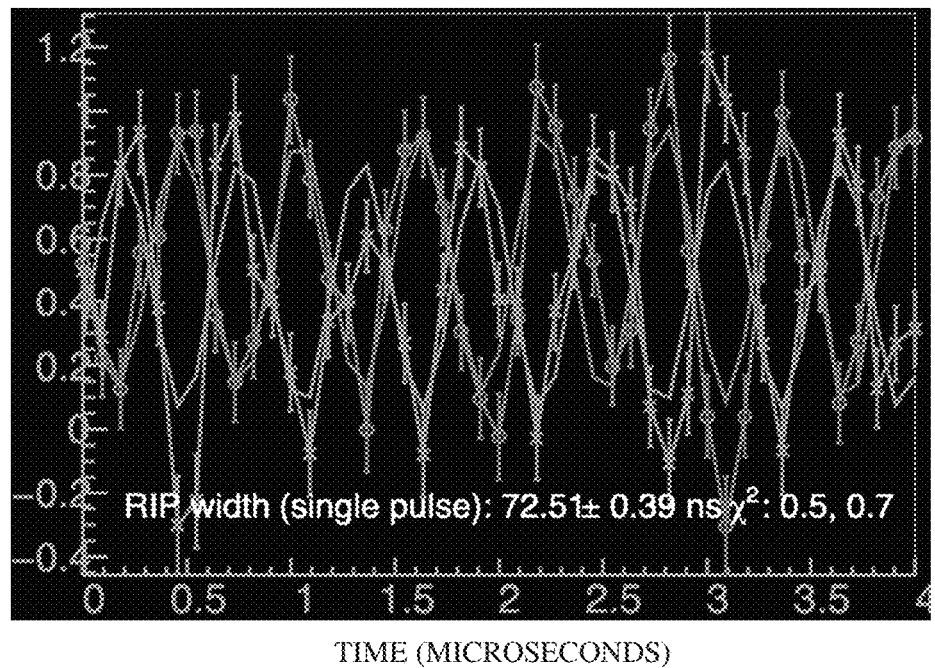
Z ROTATIONS OF BRIGHT MODE OF SPECTATOR QUBIT IN
RESPONSE TO APPLICATION OF ECHOED DARK MODE
EXCITATION PULSE SEQUENCE TO CONTROL QUBIT
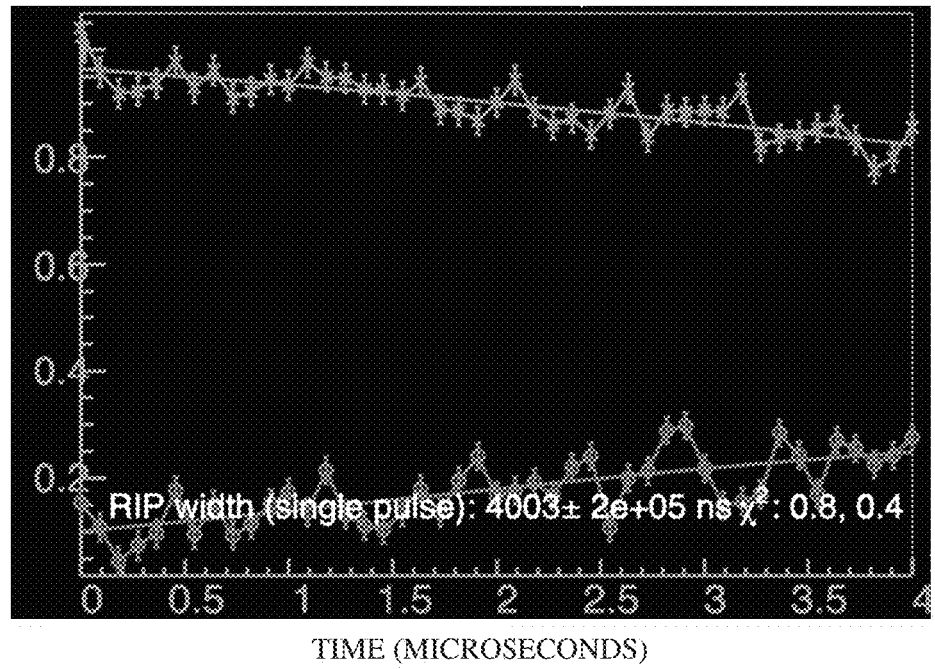
FIG. 13

DRIVING DARK MODES TO FACILITATE ENTANGLEMENT

BACKGROUND

The subject disclosure relates generally to superconducting qubits, and more specifically to facilitating entanglement between superconducting qubits by driving dark modes.

Some existing techniques for facilitating entanglement between superconducting qubits involve high-power microwave drive signals. Such existing techniques consume excessive amounts of energy and can detrimentally affect the superconducting qubits. Other existing techniques for facilitating entanglement between superconducting qubits involve large flux-tunable buses. Such other existing techniques consume excessive chip real-estate.

Accordingly, systems and/or techniques that can address one or more of these technical problems can be desirable.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, devices, systems, computer-implemented methods, apparatus and/or computer program products that facilitate entanglement between superconducting qubits by driving of dark modes are described.

According to one or more embodiments, a method is provided. In various aspects, the method can comprise accessing a first multi-mode qubit that is coupled by a mode-selective coupler to a second multi-mode qubit. In various cases, the mode-selective coupler can cause a dark mode of the first multi-mode qubit to be coupled to another dark mode of the second multi-mode qubit, and the mode-selective coupler can cause a bright mode of the first multi-mode qubit to remain uncoupled from another bright mode of the second multi-mode qubit. In various instances, the method can further comprise exciting the dark mode of the first multi-mode qubit. In various cases, the exciting the dark mode can entangle the first multi-mode qubit with the second multi-mode qubit. In various aspects, the exciting the dark mode can comprise applying a pi-pulse to the first multi-mode qubit, idling for a predetermined time period after the applying the pi-pulse, and applying a negative pi-pulse to the first multi-mode qubit based on the predetermined time period elapsing.

According to one or more embodiments, a device is provided. In various aspects, the device can comprise a first multi-mode qubit and a second multi-mode qubit. In various instances, the device can further comprise a mode-selective coupler that couples the first multi-mode qubit to the second multi-mode qubit. In various cases, the mode-selective coupler can cause a dark mode of the first multi-mode qubit to be coupled to another dark mode of the second multi-mode qubit, and the mode-selective coupler can cause a bright mode of the first multi-mode qubit to remain uncoupled from another bright mode of the second multi-mode qubit. In various instances, the mode-selective coupler can be configured to, upon excitation of the dark mode of the first multi-mode qubit, entangle the first multi-mode qubit with the second multi-mode qubit. In various aspects, the dark mode can become excited via application of a pi-pulse to the first multi-mode qubit and application of a negative pi-pulse to the first multi-mode qubit after a predetermined time period has elapsed following the application of the pi-pulse.

According to one or more embodiments, a method is provided. In various aspects, the method can comprise accessing a first two-junction transmon qubit and a second two-junction transmon qubit. In various instances, a middle capacitor pad of the first two-junction transmon qubit can be capacitively coupled to another middle capacitor pad of the second two-junction transmon qubit, such that a dark mode of the first two-junction transmon qubit is coupled to another dark mode of the second two-junction transmon qubit, and such that a bright mode of the first two-junction transmon qubit is uncoupled from another bright mode of the second two-junction transmon qubit. In various aspects, the method can further comprise entangling the first two-junction transmon qubit with the second two-junction transmon qubit, by driving the first two-junction transmon qubit with a dark mode excitation pulse sequence. In various cases, the dark mode excitation pulse sequence can include a pi-pulse, an idle time, and a negative pi-pulse.

DESCRIPTION OF THE DRAWINGS

The patent or application file contains at least one drawing executed in color. Copies of this patent or patent application publication with color drawing(s) will be provided by the Office upon request and payment of the necessary fee.

FIG. 5 illustrates example, non-limiting graphs showing how entanglement can be facilitated by dark mode coupling between superconducting qubits in accordance with one or more embodiments described herein.

FIG. 7 illustrates example, non-limiting graphs showing how entanglement can be facilitated by a dark mode excitation pulse sequence in accordance with one or more embodiments described herein.

FIG. 13 illustrates example, non-limiting graphs showing a spectator qubit's response to an echoed dark mode excitation pulse sequence in accordance with one or more embodiments described herein.

DETAILED DESCRIPTION

Figure 1:
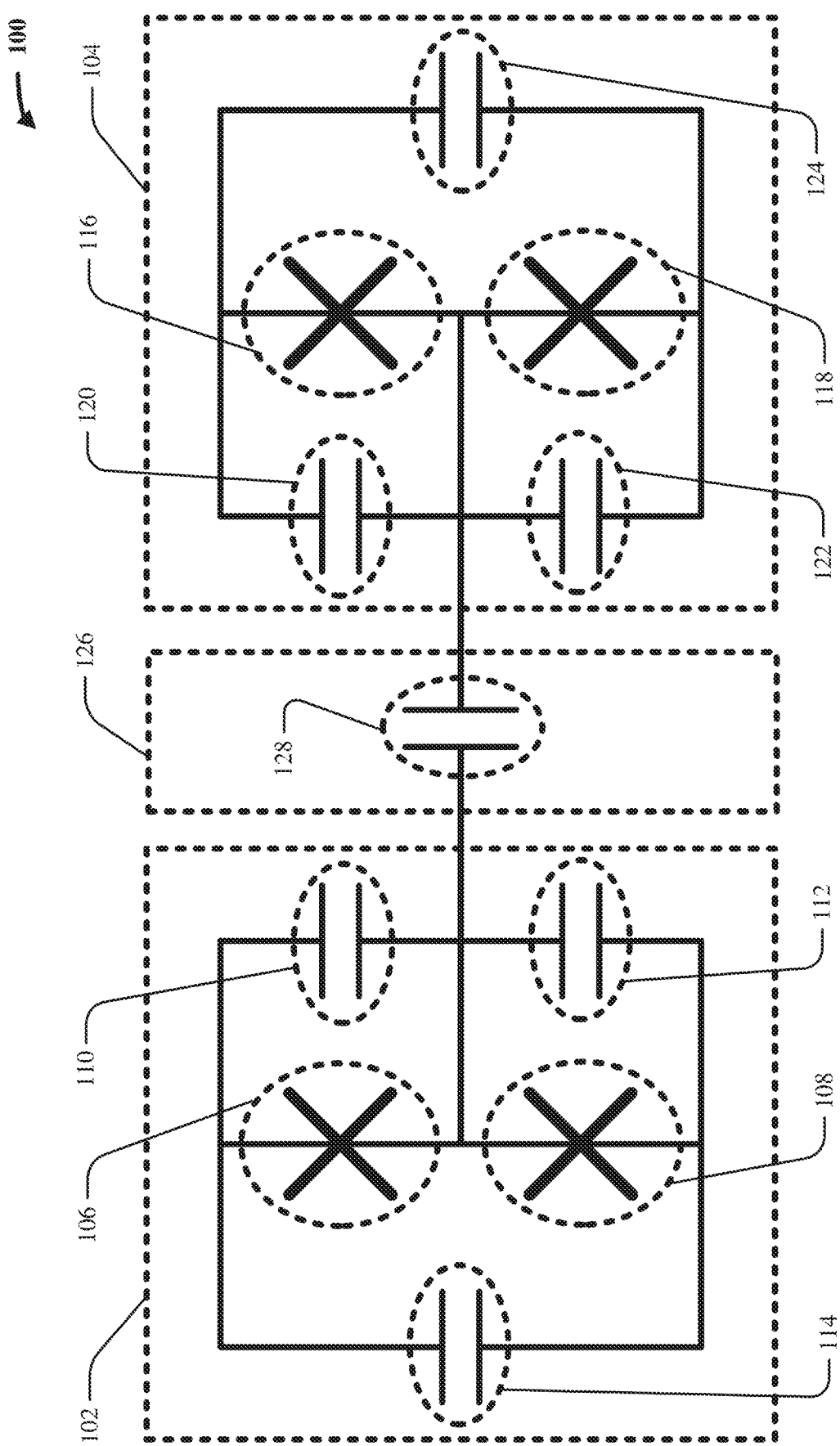
FIG. 1 illustrates a circuit diagram of an example, non-limiting system that facilitates dark mode coupling between superconducting qubits in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Superconducting qubits are a promising technology in the quest to build large-scale quantum computing systems. A superconducting qubit can, in various cases, include one or more Josephson junctions (e.g., macroscopic structures that can exhibit quantum mechanical behavior) that are shunted by one or more capacitors. In various instances, a quantum computing system can be formed based on a two-dimensional lattice of superconducting qubits (e.g., a quantum computing lattice) in which a pair of neighboring superconducting qubits can be coupled by a bus resonator (e.g., a microwave resonator). In various cases, a coupled pair of neighboring superconducting qubits can be entangled via a two-qubit gate called a cross-resonance gate and/or an entangling gate. In various aspects, a cross-resonance gate can be implemented by driving one superconducting qubit, called a control qubit, with a microwave pulse and/or tone that is at the transition frequency (e.g., operational frequency and/or qubit frequency) of an adjacent and/or neighboring superconducting qubit, called a target qubit. In various instances, the control qubit can transmit a pulse and/or tone to the target qubit in response to being driven by the microwave pulse and/or tone. In various aspects, the amplitude of the pulse and/or tone that is transmitted from the control qubit to the target qubit can depend upon the state of the control qubit, thus entangling the two superconducting qubits. In other words, the target qubit can undergo qubit rotations the rate of which depend on the state of the control qubit.

Some existing techniques for facilitating entanglement (e.g., for generating cross-resonance gates and/or entangling gates) between superconducting qubits involve high-power microwave drive signals. Such existing techniques can consume excessive amounts of energy (e.g., large amounts of input energy can be required to generate such high-power microwave drive signals), which can cause unwanted multiphoton transitions of superconducting qubits. Such excessive energy consumption can also cause excessive heating of superconducting qubits, which can result in dephasing. Other existing techniques for facilitating entanglement between superconducting qubits involve large flux-tunable buses. Such other existing techniques can require the implementation of additional drive lines for flux pulses, which can introduce flux noise sensitivity. Furthermore, such other existing techniques can consume excessive chip real-estate (e.g., flux-tunable buses and additional drive lines can take up large amounts of surface area on a quantum computing chip), which can make it more difficult to create quantum computing chips with higher numbers of qubits.

Accordingly, systems and/or techniques for facilitating entanglement (e.g., for generating entangling gates) of superconducting qubits that do not consume excessive power and/or chip real-estate can be desirable.

Various embodiments of the invention can solve one or more of these technical problems by facilitating entanglement via driving of dark modes. More specifically, various embodiments described herein can include a quantum computing architecture based on two-junction transmon qubits that are coupled via mode-selective couplers, where such quantum computing architecture can support the implementation of low-power entangling gates in the absence of flux-tunable buses and/or additional drive lines.

In various aspects, a two-junction transmon qubit can be a superconducting qubit that includes two capacitively-shunted Josephson junctions that are coupled in series (e.g., a two-junction transmon qubit can be formed by two single-junction transmon qubits connected and/or coupled in series). In other words, a two-junction transmon qubit can include a first Josephson junction and a second Josephson junction, where the first Josephson junction is serially coupled between a first capacitor pad and a second capacitor pad, and where the second Josephson junction is serially coupled between the second capacitor pad and a third capacitor pad. In various aspects, the second capacitor pad can be called a middle capacitor pad of the two-junction transmon qubit, and the first capacitor pad and the third capacitor pad can be called end capacitor pads of the two-junction transmon qubit. In various cases, a two-junction transmon qubit can also be referred to as a tunable coupler qubit.

In various instances, a two-junction transmon qubit can support and/or exhibit two distinct excitation modes: a dark mode and a bright mode. In various aspects, these two distinct excitation modes can have two different spatial symmetries and/or two different transition frequencies (e.g., a dark mode transition frequency and a bright transition frequency). More specifically, the dark mode of a two-junction transmon qubit can be a higher frequency excitation mode that has no net dipole moment. In other words, the dark mode can refrain from coupling to global electric fields. In contrast, the bright mode of a two-junction transmon qubit can be a lower frequency excitation mode that has a net dipole moment. That is, the bright mode can couple to global electric fields. In various instances, a two-junction transmon qubit can be encoded in either the dark mode (e.g., and can thus have a dark mode transition frequency) or the bright mode (e.g., and can thus have a bright mode transition frequency). In various aspects, short microwave pulses can be used to switch a two-junction transmon qubit between encodings (e.g., a suitable microwave pulse can be applied to a two-junction transmon qubit to switch the two-junction transmon qubit from the dark mode to the bright mode and/or from the bright mode to the dark mode).

In various embodiments and as explained in more detail below, mode-selective coupling can be implemented between a pair of two-junction transmon qubits in order to facilitate low-power and spatially-efficient entangling gates between the pair of two-junction transmon qubits.

In various aspects, a control qubit can be a two-junction transmon qubit (e.g., having two Josephson junctions, two end capacitor pads, and a middle capacitor pad). So, in various instances, the control qubit can have two distinct transition frequencies: a first dark mode transition frequency and a first bright mode transition frequency. In various aspects, the control qubit can be coupled to a target qubit. In various instances, the target qubit can also be a two-junction transmon qubit. So, in various cases, the target qubit can have two distinct transition frequencies: a second dark mode transition frequency and a second bright mode transition frequency.

In various aspects, the control qubit can be coupled to the target qubit by a mode-selective coupler. In various embodiments, the mode-selective coupler can facilitate dark mode coupling between the control qubit and the target qubit, and the mode-selective coupler can prevent bright mode coupling between the control qubit and the target qubit. That is, when coupled via the mode-selective coupler, the dark mode of the control qubit can couple to and/or entangle with the dark mode of the target qubit, but the bright mode of the control qubit cannot couple to and/or entangle with the bright mode of the target qubit. In various instances, in order to facilitate this dark mode coupling, the mode-selective coupler can comprise a capacitor that couples the middle capacitor pad of the control qubit to the middle capacitor pad of the target qubit. In various embodiments, the capacitor of the mode-selective coupler can be any suitable micro-structure and/or nano-structure that exhibits a net capacitance between the middle capacitor pad of the control qubit and the middle capacitor pad of the target qubit, such as a coplanar waveguide and/or a continuous piece of metal within any suitable threshold proximity to the middle capacitor pad of the control qubit and the middle capacitor pad of the target qubit. In various cases, a capacitance of the capacitor can be less than shunting capacitance values associated with the control qubit and less than shunting capacitance values associated with the target qubit. In various aspects, those having ordinary skill in the art will understand how to fabricate and/or implement such a capacitor between the middle capacitor pad of the control qubit and the middle capacitor pad of the target qubit. In various embodiments, such a capacitor between the middle capacitor pad of the control qubit and the middle capacitor pad of the target qubit can facilitate dark mode coupling between the control qubit and the target qubit and/or can prevent bright mode coupling between the control qubit and the target qubit.

In various aspects, when the control qubit and the target qubit are coupled via the mode-selective coupler, an entangling gate can be facilitated between the control qubit and the target qubit by a dark mode excitation pulse sequence. In various instances, the dark mode excitation pulse sequence can include a pi-pulse applied to the control qubit, an idle time after the pi-pulse during which no pulses are applied to the control qubit, and/or a negative pi-pulse applied to the control qubit after the idle time elapses. As those having ordinary skill in the art will understand, a pi-pulse can be any suitable signal and/or tone that causes a superconducting qubit to switch from a ground state to an excited state (and/or vice versa). Similarly, as those having ordinary skill in the art will also understand, a negative pi-pulse can be any suitable signal and/or tone that causes a superconducting qubit to switch from an excited state to a ground state (and/or vice versa). More specifically, the pi-pulse can have any suitable amplitude and/or phase, and the pi-pulse can exhibit a frequency that matches and/or is within any suitable threshold margin of the first dark mode transition frequency of the control qubit. Thus, the pi-pulse can cause the control qubit to switch from a dark mode ground state to a dark mode excited state. Similarly, the negative pi-pulse can have any suitable amplitude and/or phase, and the negative pi-pulse pulse can exhibit a frequency that matches and/or is within any suitable threshold margin of the first dark mode transition frequency of the control qubit. So, the negative pi-pulse can cause the control qubit to switch from a dark mode excited state to a dark mode ground state. In other words, the pi-pulse can be considering as exciting the dark mode of the control qubit, while the negative pi-pulse can be considered as de-exciting the dark mode of the control qubit.

In various aspects and as experimentally verified by the inventors of various embodiments described herein, applying the dark mode excitation pulse sequence (e.g., pi-pulse, followed by idle time, followed by negative pi-pulse) to the control qubit can cause a corresponding response in the bright mode of the target qubit. In other words, application of the dark mode excitation pulse sequence to the control qubit can cause the control qubit (e.g., dark mode of the control qubit) and the target qubit (e.g., bright mode of the target qubit) to become entangled with each other. In still other words, the dark mode excitation pulse sequence can be considered as an entangling gate that entangles the control qubit and the target qubit. Accordingly and as those having ordinary skill in the art will appreciate, the amplitude, phase, and/or length of idle time of the dark mode excitation pulse sequence can be controllably adjusted, so as to commensurately controllably adjust the type of entangling gate that is implemented by the dark mode excitation pulse sequence. As some non-limiting examples, the amplitude, phase, and/or idle time magnitude can be set to first values so that the dark mode excitation pulse sequence implements a controlled-not gate on the control qubit and the target qubit, can be set to second values so that the dark mode excitation pulse sequence implements a controlled-z gate on the control qubit and the target qubit, and/or can be set to third values so that the dark mode excitation pulse sequence implements a controlled-phase gate. Those having ordinary skill in the art will appreciate that the particular values of amplitude, phase, and/or idle time for implementing a particular entangling gate can be determined empirically (e.g., by initializing the amplitude, phase, and/or idle time of the dark mode excitation pulse sequence with any suitable values; applying the dark mode excitation pulse sequence to the control qubit; observing the resulting states of the control qubit and the target qubit; and iteratively perturbing the values of the amplitude, phase, and/or idle time until desired resulting states of the control qubit and the target qubit are obtained).

Note that the dark mode excitation pulse sequence can be implemented to cause entanglement when both the control qubit and the target qubit are two-junction transmon qubits whose middle capacitor pads are capacitively coupled. That is, implementation of the dark mode excitation pulse sequence does not require large flux-tunable buses and/or the additional drive lines that often accompany such large flux-tunable buses. Moreover, as those having ordinary skill in the art will understand, a pi-pulse and/or negative pi-pulse can be implemented on the control qubit using very little energy. Indeed, a pi-pulse and a negative pi-pulse can each independently be considered as consuming as much energy as a single-qubit gate. Accordingly, the dark mode excitation pulse sequence can itself consume very little energy (e.g., can consume an amount of energy that would be consumed by two single-qubit gates, which can be much less than an amount of energy that would be consumed by an existing entangling gate). Indeed, as experimentally verified by the inventors of various embodiments described herein, the dark mode excitation pulse sequence can be implemented using at least an order of magnitude less energy, as compared to existing microwave signals for implementing entangling gates. In other words, the dark mode excitation pulse sequence described herein can facilitate entanglement of superconducting qubits, in the absence of flux-tunable buses and without excessive consumption of energy, unlike existing techniques for facilitating entanglement. Thus, various embodiments of the invention constitute a concrete and tangible technical improvement in the field of superconducting qubits.

In various embodiments, the control qubit can further be coupled to a spectator qubit. In various aspects, the spectator qubit can be a two-junction transmon qubit. Accordingly, the spectator qubit can have its own distinct transition frequencies: a third dark mode transition frequency and a third bright mode transition frequency. In various instances, the control qubit can be coupled to the spectator qubit by another mode-selective coupler that can facilitate dark mode coupling between the control qubit and the spectator qubit and/or that can prevent bright mode coupling between the control qubit and the spectator qubit. Just like the mode-selective coupler mentioned above, the another mode-selective coupler can be a capacitor that couples the middle capacitor pad of the control qubit to another middle capacitor pad of the spectator qubit.

In various cases, it can be desired to entangle the control qubit with the target qubit. However, in some instances, if the dark mode excitation pulse sequence mentioned above is applied to the control qubit, the resulting entanglement between the control qubit and the target qubit can affect the spectator qubit and/or can be affected by the spectator qubit. To address this issue, an echoed dark mode excitation pulse sequence can be utilized, in place of the dark mode excitation pulse sequence mentioned above. In various instances, the echoed dark mode excitation pulse sequence can include a first pi-pulse applied to the control qubit, a first idle time after the first pi-pulse during which no pulses are applied to the control qubit, a first negative pi-pulse applied to the control qubit after the first idle time elapses, an echo pi-pulse applied to the spectator qubit after the first negative pi-pulse is applied to the control qubit, a second pi-pulse applied to the control qubit, a second idle time after the second pi-pulse during which no pulses are applied to the control qubit, and a second negative pi-pulse applied to the control qubit after the second idle time elapses. In various aspects, the first pi-pulse, first negative pi-pulse, second pi-pulse, and/or second negative pi-pulse can have any suitable amplitudes and/or phases, and can exhibit frequencies that match and/or are within any suitable threshold margin of the first dark mode transition frequency of the control qubit. In contrast, the echo pi-pulse can have any suitable amplitude and/or phase, and can exhibit a frequency that matches and/or is within any suitable threshold margin of the third bright mode transition frequency of the spectator qubit.

In various aspects and as experimentally verified by the inventors of various embodiments described herein, applying the echoed dark mode excitation pulse sequence (e.g., pi-pulse, followed by idle time, followed by negative pi-pulse, followed by echo pi-pulse on spectator, followed by another pi-pulse, followed by another idle time, followed by another negative pi-pulse) to the control qubit can cause a corresponding response in the bright mode of the target qubit, while simultaneously erasing any corresponding response in the bright mode of the spectator qubit. In other words, application of the echoed dark mode excitation pulse sequence to the control qubit can cause the control qubit (e.g., dark mode of the control qubit) and the target qubit (e.g., bright mode of the target qubit) to become entangled with each other, while preventing the bright mode of the spectator qubit from influencing and/or being influenced by such entanglement. In still other words, the echoed dark mode excitation pulse sequence can be considered as an entangling gate that entangles the control qubit and the target qubit, while preventing entanglement with the spectator qubit. Accordingly and as those having ordinary skill in the art will appreciate, the frequency, amplitude, phase, and/or length of idle time of the echoed dark mode excitation pulse sequence can be controllably adjusted, so as to commensurately controllably adjust the type of entangling gate that is implemented by the echoed dark mode excitation pulse sequence.

Just as with the dark mode excitation pulse sequence, the echoed dark mode excitation pulse sequence can implement entanglement without requiring flux-tunable buses and by using at least an order of magnitude less energy as compared to existing entangling techniques. Again, this constitutes a concrete and tangible technical improvement in the field of superconducting qubits.

Various embodiments of the invention include novel systems, architectures, and/or techniques for facilitating entanglement via driving of dark modes that are not abstract, that are not natural phenomena, that are not laws of nature, and that cannot be performed as a set of mental acts by a human. Instead, various embodiments of the invention include systems, architectures, and/or techniques for facilitating superconducting qubit entanglement without excessive energy consumption and without spatially-inefficient flux-tunable buses. As mentioned above, some existing techniques for facilitating entanglement (e.g., for generating an entangling gate) between two superconducting qubits require high-power microwave signals, which can cause dephasing of the superconducting qubits due to overheating. As also mentioned above, other existing techniques for facilitating entanglement between two superconducting qubits require flux-tunable buses, which can be large, meandering, spatially-inefficient structures that take up excessive surface area on a quantum chip. In stark contrast, embodiments described herein can facilitate entanglement without such flux-tunable buses and by consuming an order of magnitude less energy. Specifically, a control qubit can be coupled to a target qubit by a mode-selective coupler, where the control qubit and the target qubit are both two-junction transmon qubits as described herein. Accordingly, the control qubit can have a dark mode and a bright mode, and the target qubit can likewise have a dark mode and a bright mode. In various cases, the mode-selective coupler can be a capacitor that couples a middle capacitor pad of the control qubit to a middle capacitor of the target qubit. This can cause the dark mode of the control qubit to be coupled to the dark mode of the target qubit, and this can simultaneously prevent the bright mode of the control qubit from being coupled to the bright mode of the target qubit. With this architecture, entanglement between the control qubit and the target qubit can be facilitated by a dark mode excitation pulse sequence, which can comprise a pi-pulse applied to the control qubit at the dark mode transition frequency of the control qubit, an idle time, and a negative pi-pulse applied to the control qubit at the dark mode transition frequency of the control qubit. Application of the dark mode excitation pulse sequence can cause a corresponding response in the bright mode of the target qubit, notwithstanding that the dark mode excitation pulse sequence can lack a pulse signal that is applied directly to the target qubit. That is, the dark mode excitation pulse sequence can be considered as implementing an entangling gate that operates on the control qubit and the target qubit. In various cases, the amplitude, phase, and/or idle time length of the dark mode excitation pulse sequence can be controllably modulated, so as to controllably modulate the type of entangling gate that is implemented by the dark mode excitation pulse sequence. When the control qubit is coupled to one or more spectator qubits, an echoed-version of the dark mode excitation pulse sequence can be implemented, so as to facilitate entanglement between the control qubit and the target qubit while preventing the one or more spectator qubits from affecting and/or being affected by such entanglement. In any case, the dark mode excitation pulse sequence described herein can cause entanglement between superconducting qubits, can consume an order of magnitude less power as compared to existing entangling techniques, and/or can function without large and spatially-inefficient flux-tunable buses. Thus, various embodiments of the invention can improve the performance of a quantum computing system (e.g., can provide entanglement with significantly less power consumption; can provide entanglement without wasteful use of chip real-estate), and so various embodiments of the invention constitute a concrete and tangible technical improvement in the field of superconducting qubits.

In various aspects, it should be appreciated that the figures of this disclosure are non-limiting examples and are not necessarily drawn to scale.

FIG. 1 illustrates a circuit diagram of an example, non-limiting system 100 that can facilitate dark mode coupling between superconducting qubits in accordance with one or more embodiments described herein. As shown, the system 100 can comprise a two-junction transmon qubit 102 and a two-junction transmon qubit 104.

In various embodiments, the two-junction transmon qubit 102 can comprise a Josephson junction 106 that is shunted by a capacitor 110. In various cases, the two-junction transmon qubit 102 can also comprise a Josephson junction 108 that is shunted by a capacitor 112. In various instances, the two-junction transmon qubit 102 can further comprise a capacitor 114 that shunts both the Josephson junction 106 and the Josephson junction 108. In various aspects, the two-junction transmon qubit 102 can be considered as comprising two single-junction transmon qubits that are coupled in series such that they share a capacitor pad. Specifically, the Josephson junction 106 shunted by the capacitor 110 can be considered as a first single-junction transmon qubit formed from a first capacitor pad and a second capacitor pad (not shown in FIG. 1). In various aspects, the first capacitor pad and the second capacitor pad can shunt the Josephson junction 106 to form the capacitor 110. Moreover, the Josephson junction 108 shunted by the capacitor 112 can be considered as a second single-junction transmon qubit formed from the second capacitor pad and a third capacitor pad (not shown in FIG. 1). In various aspects, the second capacitor pad and the third capacitor pad can shunt the Josephson junction 108 to form the capacitor 112. Moreover, the first capacitor pad and the third capacitor pad can shunt both the Josephson junction 106 and the Josephson junction 108 to form the capacitor 114. In various aspects, a physical structure of the two-junction transmon qubit 102 can be more clearly depicted in FIG. 2, discussed below.

In various instances, the two-junction transmon qubit 102 can support and/or exhibit two distinct excitation modes. In various aspects, these two distinct excitation modes can be referred to as a dark mode and a bright mode. In various aspects, as mentioned above, the dark mode can be associated with a dark mode transition frequency of the two-junction transmon qubit 102, and the bright mode can be associated with a bright mode transition frequency of the two-junction transmon qubit 102, where the dark mode transition frequency is higher than the bright mode transition frequency. As one having ordinary skill in the art will understand, the dark mode transition frequency and/or the bright mode transition frequency of the two-junction transmon qubit 102 can be set and/or controlled during fabrication, subject to inherent and/or unintentional process variations.

In some embodiments, the two-junction transmon qubit 102 can be encoded in either the dark mode and/or the bright mode. In various aspects, when the two-junction transmon qubit 102 is encoded in the dark mode, the two-junction transmon qubit 102 can exhibit the dark mode transition frequency and can avoid exhibiting the bright mode transition frequency. In various aspects, when the two-junction transmon qubit 102 is encoded in the bright mode, the two-junction transmon qubit 102 can exhibit the bright mode transition frequency and can avoid exhibiting the dark mode transition frequency.

In various aspects, the two-junction transmon qubit 102 can be encoded into the dark mode and/or the bright mode (e.g., the two-junction transmon qubit 102 can be switched from the dark mode to the bright mode and/or from the bright mode to the dark mode) by short microwave pulses and/or tones, as understood by those of ordinary skill in the art.

In various embodiments, the two-junction transmon qubit 104 can be similar to the two-junction transmon qubit 102. That is, in various aspects, the two-junction transmon qubit 104 can comprise a Josephson junction 116 that is shunted by a capacitor 120. In various cases, the two-junction transmon qubit 104 can also comprise a Josephson junction 118 that is shunted by a capacitor 122. In various instances, the two-junction transmon qubit 104 can further comprise a capacitor 124 that shunts both the Josephson junction 116 and the Josephson junction 118. In various aspects, the two-junction transmon qubit 104 can be considered as comprising two single-junction transmon qubits that are coupled in series such that they share a capacitor pad. Specifically, the Josephson junction 116 shunted by the capacitor 120 can be considered as a first single-junction transmon qubit formed from a first capacitor pad and a second capacitor pad (separate from the first and second capacitor pads of the two-junction transmon qubit 102, and not shown in FIG. 1). In various aspects, the first capacitor pad and the second capacitor pad can shunt the Josephson junction 116 to form the capacitor 120. Moreover, the Josephson junction 118 shunted by the capacitor 122 can be considered as a second single-junction transmon qubit formed from the second capacitor pad and a third capacitor pad (separate from the second and third capacitor pads of the two-junction transmon qubit 102, and not shown in FIG. 1). In various aspects, the second capacitor pad and the third capacitor pad can shunt the Josephson junction 118 to form the capacitor 122. Moreover, the first capacitor pad and the third capacitor pad can shunt both the Josephson junction 116 and the Josephson junction 118 to form the capacitor 124. In various aspects, a physical structure of the two-junction transmon qubit 104 can be more clearly depicted in FIG. 2, discussed below.

In various instances, the two-junction transmon qubit 104 can support and/or exhibit two distinct excitation modes. In various aspects, these two distinct excitation modes can be referred to as a dark mode and a bright mode. In various aspects, the dark mode can be associated with a dark mode transition frequency of the two-junction transmon qubit 104, and the bright mode can be associated with a bright mode transition frequency of the two-junction transmon qubit 104, where the dark mode transition frequency is higher than the bright mode transition frequency. In various aspects, the dark mode transition frequency and the bright mode transition frequency of the two-junction transmon qubit 104 can be respectively different from and/or unequal to the dark mode transition frequency and the bright mode transition frequency of the two-junction transmon qubit 102.

In some embodiments, just as with the two-junction transmon qubit 102, the two-junction transmon qubit 104 can be encoded in either the dark mode and/or the bright mode. In various cases, short microwave pulses and/or tones can be used to switch between the dark mode encoding and the bright mode encoding. As one having ordinary skill in the art will understand, the dark mode transition frequency and/or the bright mode transition frequency of the two-junction transmon qubit 104 can be set and/or controlled during fabrication, subject to inherent and/or unintentional process variations.

In various embodiments, the two-junction transmon qubit 102 can be coupled to the two-junction transmon qubit 104 by a mode-selective coupler 126. In various aspects, the mode-selective coupler 126 can facilitate dark mode coupling between the two-junction transmon qubit 102 and the two-junction transmon qubit 104, and the mode-selective coupler 126 can prevent bright mode coupling between the two-junction transmon qubit 102 and the two-junction transmon qubit 104. In other words, the mode-selective coupler 126 can function such that the dark mode excitation of the two-junction transmon qubit 102 can couple to and/or entangle with the dark mode excitation of the two-junction transmon qubit 104, and such that the bright mode excitation of the two-junction transmon qubit 102 cannot couple to and/or entangle with the bright mode excitation of the two-junction transmon qubit 104. In various aspects, as shown, the mode-selective coupler 126 can comprise a capacitor 128. In various aspects, the capacitor 128 can capacitively couple a middle capacitor pad (e.g., the second capacitor pad) of the two-junction transmon qubit 102 to a middle capacitor pad (e.g., the second capacitor pad) of the two-junction transmon qubit 104. In various aspects, the capacitance of the capacitor 128 can be less than shunting capacitance values of the two-junction transmon qubit 102 (e.g., less than the capacitance of the capacitor 110, less than the capacitance of the capacitor 112, and less than the capacitance of the capacitor 114) and less than shunting capacitance values of the two-junction transmon qubit 104 (e.g., less than the capacitance of the capacitor 120, less than the capacitance of the capacitor 122, and less than the capacitance of the capacitor 124). In various aspects, such a capacitive coupling structure can facilitate dark mode coupling between the two-junction transmon qubit 102 and the two-junction transmon qubit 104 while preventing bright mode coupling between the two-junction transmon qubit 102 and the two-junction transmon qubit 104. In various instances, the structure of the mode-selective coupler 126 can be more clearly depicted in FIG. 2, discussed below.

In various aspects, the two-junction transmon qubit 102 can function and/or be referred to as a control qubit, and the two-junction transmon qubit 104 can function and/or be referred to as a target qubit. In various aspects, a cross-resonance direction can be said to run along the mode-selective coupler 126 from the two-junction transmon qubit 102 to the two-junction transmon qubit 104.

Figure 2:
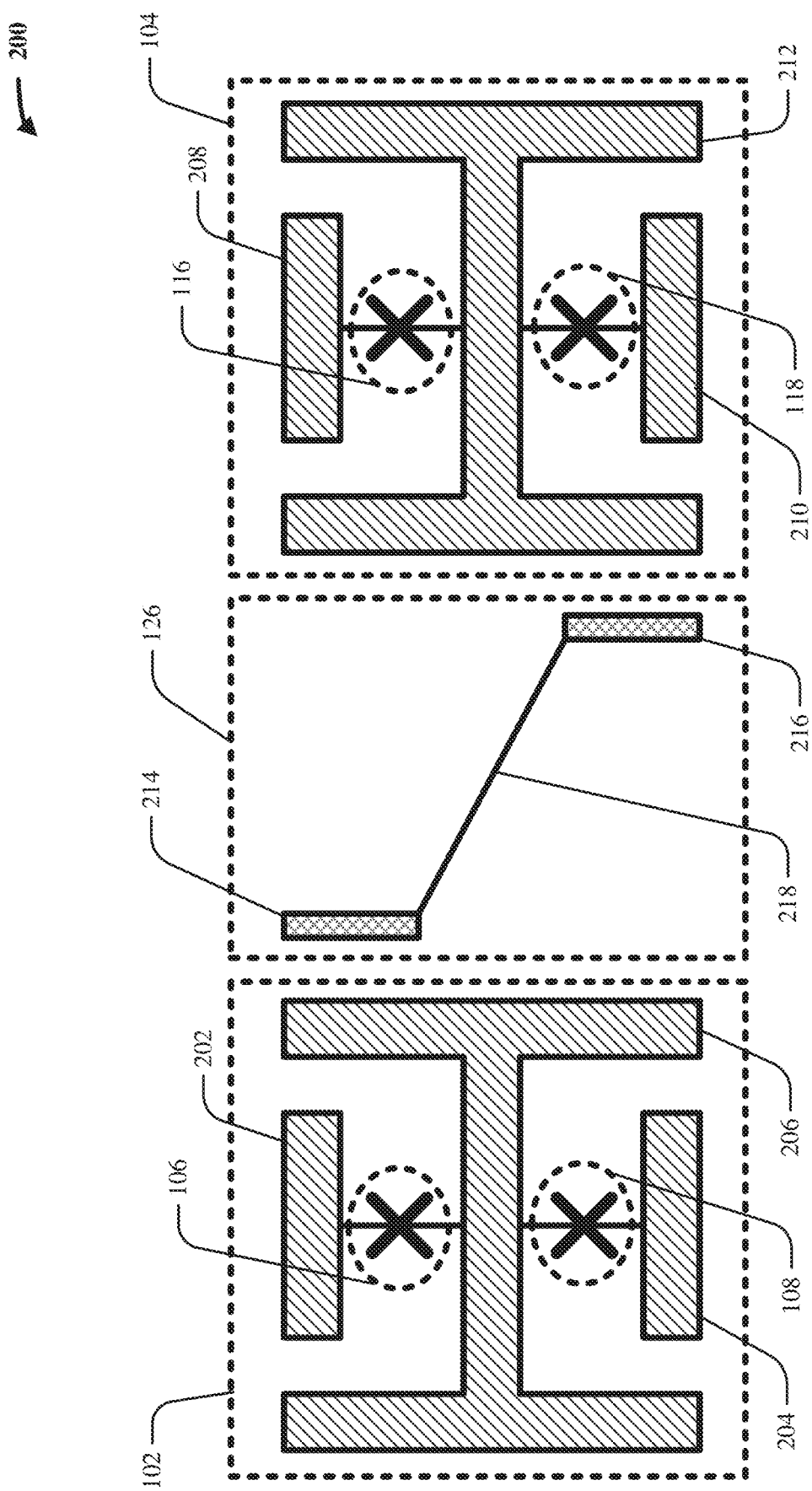
FIG. 2 illustrates a block diagram of an example, non-limiting system that facilitates dark mode coupling between superconducting qubits in accordance with one or more embodiments described herein.

FIG. 2 illustrates a block diagram of an example, non-limiting system 200 that can facilitate dark mode coupling between superconducting qubits in accordance with one or more embodiments described herein. In various aspects, FIG. 2 can illustrate a physical structure/architecture that can implement the circuit depicted in FIG. 1.

In various aspects, the system 200 can comprise the two-junction transmon qubit 102 and the two-junction transmon qubit 104, which can be coupled together by the mode-selective coupler 126. As explained above, FIG. 1 depicts a circuit diagram of the two-junction transmon qubit 102, the two-junction transmon qubit 104, and the mode-selective coupler 126. FIG. 2, on the other hand, depicts physical structures and/or architectures that can be used to implement the two-junction transmon qubit 102, the two-junction transmon qubit 104, and the mode-selective coupler 126.

In various embodiments, the two-junction transmon qubit 102 can comprise the Josephson junction 106, the Josephson junction 108, an end capacitor pad 202, an end capacitor pad 204, and a middle capacitor pad 206. As shown, in various aspects, the end capacitor pad 202 can be coupled to the Josephson junction 106. Similarly, as shown, the middle capacitor pad 206 can be coupled to the Josephson junction 106, such that the end capacitor pad 202, the Josephson junction 106, and the middle capacitor pad 206 can be in series with each other. In various aspects, the end capacitor pad 202 and the middle capacitor pad 206 can be considered as shunting the Josephson junction 106. In other words, the end capacitor pad 202 and the middle capacitor pad 206 can, in various aspects, collectively form and/or function as the capacitor 110.

As shown, in various aspects, the Josephson junction 108 can be coupled to the middle capacitor pad 206. Similarly, as shown, the end capacitor pad 204 can be coupled to the Josephson junction 108, such that the middle capacitor pad 206, the Josephson junction 108, and the end capacitor pad 204 can be in series with each other. In various aspects, the middle capacitor pad 206 and the end capacitor pad 204 can be considered as shunting the Josephson junction 108. In other words, the middle capacitor pad 206 and the end capacitor pad 204 can, in various aspects, collectively form and/or function as the capacitor 112.

As shown, in various aspects, the end capacitor pad 202, the Josephson junction 106, the middle capacitor pad 206, the Josephson junction 108, and the end capacitor pad 204 can be coupled together such that they are all in series with each other. In various instances, the end capacitor pad 202 and the end capacitor pad 204 can be considered as shunting both the Josephson junction 106 and the Josephson junction 108. In other words, the end capacitor pad 202 and the end capacitor pad 204 can, in various aspects, collectively form and/or function as the capacitor 114.

In various aspects, as mentioned above, the two-junction transmon qubit 102 can be considered as two serially-coupled single-junction transmon qubits that share a middle capacitor pad. Specifically, the end capacitor pad 202, the Josephson junction 106, and the middle capacitor pad 206 can be considered as a first single-junction transmon qubit. Similarly, the middle capacitor pad 206, the Josephson junction 108, and the end capacitor pad 204 can be considered as a second single-junction transmon qubit that is in series with the first single-junction transmon qubit. As shown, the first single-junction transmon qubit and the second single-junction transmon qubit can share the middle capacitor pad 206.

In various embodiments, the end capacitor pad 202, the middle capacitor pad 206, and the end capacitor pad 204 can be composed of any suitable material for forming shunting capacitors in quantum computing systems (e.g., any suitable superconducting materials such as niobium). Although FIG. 2 depicts the end capacitor pad 202, the middle capacitor pad 206, and the end capacitor pad 204 as being composed of the same materials, this is non-limiting and for ease of illustration. In various aspects, the end capacitor pad 202, the middle capacitor pad 206, and the end capacitor pad 204 can comprise different materials. In various embodiments, the end capacitor pad 202, the middle capacitor pad 206, and the end capacitor pad 204 can have any suitable sizes, shapes, and/or dimensions. Although FIG. 2 depicts the end capacitor pad 202 and the end capacitor pad 204 as having similar sizes, shapes, and/or dimensions, this is non-limiting and for purposes of illustration. In various aspects, the end capacitor pad 202 and the end capacitor pad 204 can have different sizes, shapes, and/or dimensions. In various aspects, the middle capacitor pad 206 can exhibit an H-shape, as shown. In various aspects, such an H-shape can provide additional surface area for coupling purposes. That is, such an H-shape can, in some cases, increase the lateral surface area of the middle capacitor pad 206 that is available for coupling (e.g., capacitive coupling, direct coupling, and/or otherwise) any other suitable quantum computing components and/or circuitry to the middle capacitor pad 206. In various embodiments, the middle capacitor pad 206 can have any other suitable size, shape, and/or dimensions.

In various embodiments, the two-junction transmon qubit 104 can exhibit an analogous structure and/or architecture as the two-junction transmon qubit 102. In various aspects, the two-junction transmon qubit 104 can comprise the Josephson junction 116, the Josephson junction 118, an end capacitor pad 208, an end capacitor pad 210, and a middle capacitor pad 212. As shown, in various aspects, the end capacitor pad 208 can be coupled to the Josephson junction 116. Similarly, as shown, the middle capacitor pad 212 can be coupled to the Josephson junction 116, such that the end capacitor pad 208, the Josephson junction 116, and the middle capacitor pad 212 can be in series with each other. In various aspects, the end capacitor pad 208 and the middle capacitor pad 212 can be considered as shunting the Josephson junction 116. In other words, the end capacitor pad 208 and the middle capacitor pad 212 can, in various aspects, collectively form and/or function as the capacitor 120.

As shown, in various aspects, the Josephson junction 118 can be coupled to the middle capacitor pad 212. Similarly, as shown, the end capacitor pad 210 can be coupled to the Josephson junction 118, such that the middle capacitor pad 212, the Josephson junction 118, and the end capacitor pad 210 can be in series with each other. In various aspects, the middle capacitor pad 212 and the end capacitor pad 210 can be considered as shunting the Josephson junction 118. In other words, the middle capacitor pad 212 and the end capacitor pad 210 can, in various aspects, collectively form and/or function as the capacitor 122.

As shown, in various aspects, the end capacitor pad 208, the Josephson junction 116, the middle capacitor pad 212, the Josephson junction 118, and the end capacitor pad 210 can be coupled together such that they are all in series with each other. In various instances, the end capacitor pad 208 and the end capacitor pad 210 can be considered as shunting both the Josephson junction 116 and the Josephson junction 118. In other words, the end capacitor pad 208 and the end capacitor pad 210 can, in various aspects, collectively form and/or function as the capacitor 124.

In various aspects, as mentioned above, the two-junction transmon qubit 104 can be considered as two serially-coupled single-junction transmon qubits that share a middle capacitor pad. Specifically, the end capacitor pad 208, the Josephson junction 116, and the middle capacitor pad 212 can be considered as a first single-junction transmon qubit. Similarly, the middle capacitor pad 212, the Josephson junction 118, and the end capacitor pad 210 can be considered as a second single-junction transmon qubit that is in series with the first single-junction transmon qubit. As shown, the first single-junction transmon qubit and the second single-junction transmon qubit can share the middle capacitor pad 212.

In various aspects, the sizes, shapes, dimensions, and/or materials of the end capacitor pad 208, the middle capacitor pad 212, and the end capacitor pad 210 can be as described above with respect to the end capacitor pad 202, the middle capacitor pad 206, and the end capacitor pad 204.

In various embodiments, as shown, the mode-selective coupler 126 can comprise a capacitor pad 214, a capacitor pad 216, and a transmission line 218. In various aspects, the capacitor pad 214 can be capacitively coupled to the middle capacitor pad 206, and the capacitor pad 216 can be capacitively coupled to the middle capacitor pad 212. In various aspects, the transmission line 218 can directly couple the capacitor pad 214 with the capacitor pad 216. In various instances, the capacitor pad 214, the capacitor pad 216, and the transmission line 218 can collectively exhibit a net capacitance. In other words, the capacitor pad 214, the capacitor pad 216, and the transmission line 218 can, in various cases, collectively form and/or function as the capacitor 128. As mentioned above, the capacitance of the capacitor 128 (e.g., the net capacitance of the capacitor pad 214, the capacitor pad 216, and the transmission line 218) can be less than shunting capacitance values of the two-junction transmon qubit 102 (e.g., less than the capacitance of the capacitor 110, less than the capacitance of the capacitor 112, and less than the capacitance of the capacitor 114) and can be less than shunting capacitance values of the two-junction transmon qubit 104 (e.g., less than the capacitance of the capacitor 120, less than the capacitance of the capacitor 122, and less than the capacitance of the capacitor 124).

In various embodiments, the capacitor pad 214 and the capacitor pad 216 can be composed of any suitable material for forming capacitors and/or capacitive connections in quantum computing systems (e.g., any suitable superconducting materials such as niobium). Although FIG. 2 depicts the capacitor pad 214 and the capacitor pad 216 as being composed of the same materials, this is non-limiting and for purposes of illustration. In various aspects, the capacitor pad 214 and the capacitor pad 216 can comprise different materials. In various embodiments, the capacitor pad 214 and the capacitor pad 216 can have any suitable sizes, shapes, and/or dimensions. Although FIG. 2 depicts the capacitor pad 214 and the capacitor pad 216 as having similar sizes, shapes, and/or dimensions, this is non-limiting and for illustration only. In various aspects, the capacitor pad 214 and the capacitor pad 216 can have different sizes, shapes, and/or dimensions. In various aspects, the transmission line 218 can be composed of any suitable conductive material used in quantum computing systems (e.g., any suitable superconducting materials such as niobium). Although FIG. 2 depicts the transmission line 218 as being straight, this is non-limiting and for illustration only. In various aspects, the transmission line 218 can have any suitable size, shape, and/or dimensions.

In various aspects, the mode-selective coupler 126 can have a different structure and/or architecture than that depicted in FIG. 2 (e.g., can have different components than the capacitor pad 214, the capacitor pad 216, and the transmission line 218). Specifically, in various embodiments, the mode-selective coupler 126 can be any suitable structure, architecture, and/or quantum circuitry component that exhibits a net capacitance between the middle capacitor pad 206 and the middle capacitor pad 212, such as a coplanar waveguide. In other words, the mode-selective coupler 126 can be any suitable structure that functions as a capacitor between the middle capacitor pad 206 and the middle capacitor pad 212, and/or that otherwise capacitively couples the middle capacitor pad 206 to the middle capacitor pad 212.

In various aspects, a net capacitive coupling as described above between the middle capacitor pad 206 and the middle capacitor pad 212 can facilitate dark mode coupling between the two-junction transmon qubit 102 and the two-junction transmon qubit 104. Moreover, in various aspects, a net capacitive coupling as described above between the middle capacitor pad 206 and the middle capacitor pad 212 can prevent bright mode coupling between the two-junction transmon qubit 102 and the two-junction transmon qubit 104.

Figure 3:
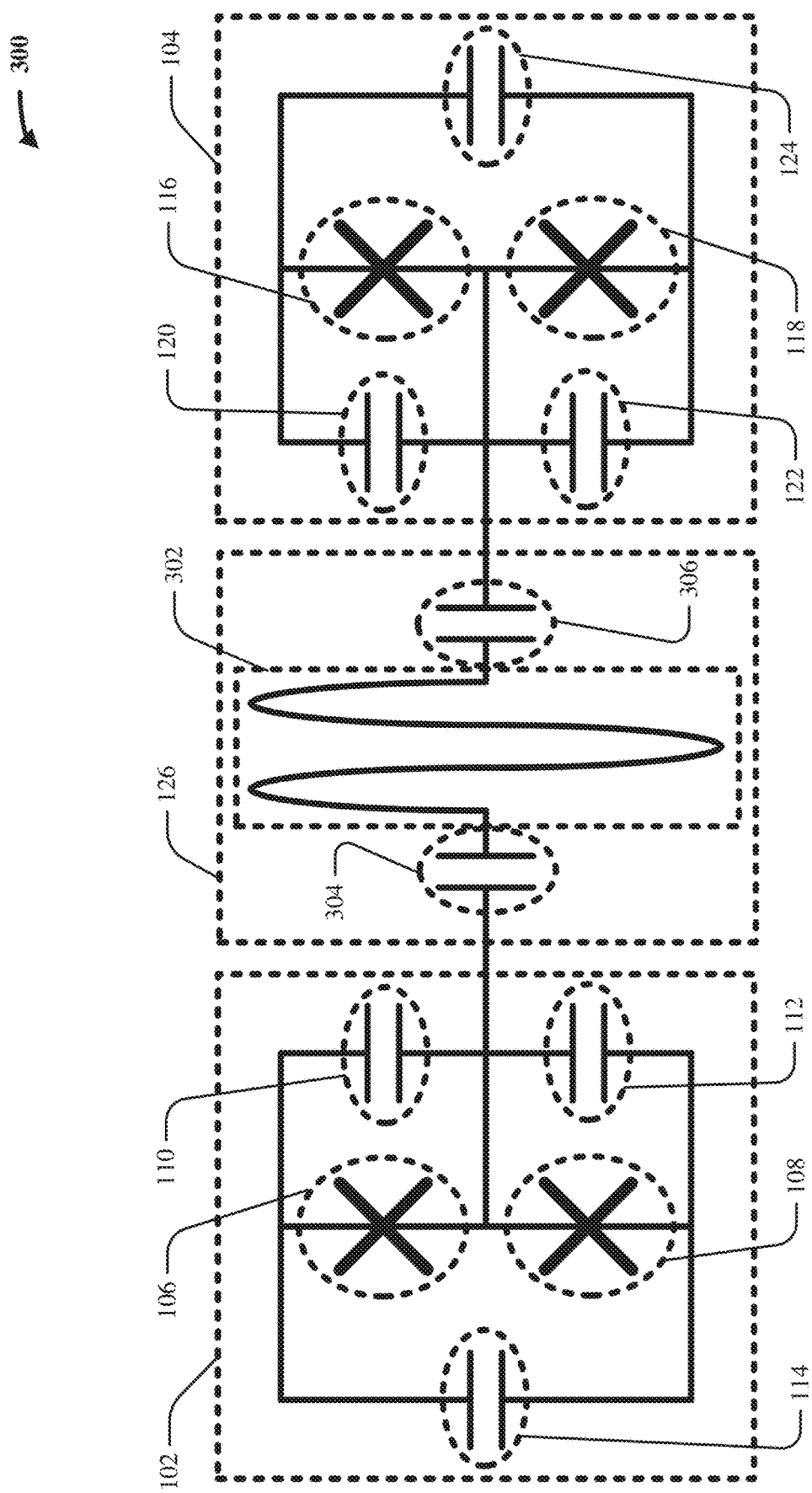
FIG. 3 illustrates a circuit diagram of an example, non-limiting system that facilitates dark mode coupling between superconducting qubits in accordance with one or more embodiments described herein.

FIG. 3 illustrates a circuit diagram of an example, non-limiting system 300 that can facilitate dark mode coupling between superconducting qubits in accordance with one or more embodiments described herein. As shown, the system 300 can comprise the two-junction transmon qubit 102 and the two-junction transmon qubit 104, as described above.

As shown, FIG. 3 illustrates an alternative embodiment of the mode-selective coupler 126. In various aspects, the mode-selective coupler 126 can facilitate dark mode coupling between the two-junction transmon qubit 102 and the two-junction transmon qubit 104, and can prevent bright mode coupling between the two-junction transmon qubit 102 and the two-junction transmon qubit 104. However, rather than merely comprising the capacitor 128, the mode-selective coupler 126 can, in some cases, comprise a coplanar waveguide 302, a capacitor 304, and a capacitor 306. In various aspects, the coplanar waveguide 302 can be any suitable coplanar waveguide and/or bus resonator, and the coplanar waveguide 302 can comprise any suitable shape, dimensions, and/or materials. In various instances, the capacitor 304 can capacitively couple the middle capacitor pad (e.g., the second capacitor pad) of the two-junction transmon qubit 102 to the coplanar waveguide 302. Similarly, the capacitor 306 can capacitively couple the middle capacitor pad (e.g., the second capacitor pad) of the two-junction transmon qubit 104 to the coplanar waveguide 302. In various aspects, a net capacitance collectively exhibited by the coplanar waveguide 302, the capacitor 304, and the capacitor 306 can be less than shunting capacitance values of the two-junction transmon qubit 102 (e.g., less than the capacitance of the capacitor 110, less than the capacitance of the capacitor 112, and less than the capacitance of the capacitor 114) and less than shunting capacitance values of the two-junction transmon qubit 104 (e.g., less than the capacitance of the capacitor 120, less than the capacitance of the capacitor 122, and less than the capacitance of the capacitor 124). In various aspects, such a capacitive coupling structure can facilitate dark mode coupling between the two-junction transmon qubit 102 and the two-junction transmon qubit 104 while preventing bright mode coupling between the two-junction transmon qubit 102 and the two-junction transmon qubit 104. In various instances, the structure of this non-limiting embodiment of the mode-selective coupler 126 can be more clearly depicted in FIG. 4, discussed below.

Figure 4:
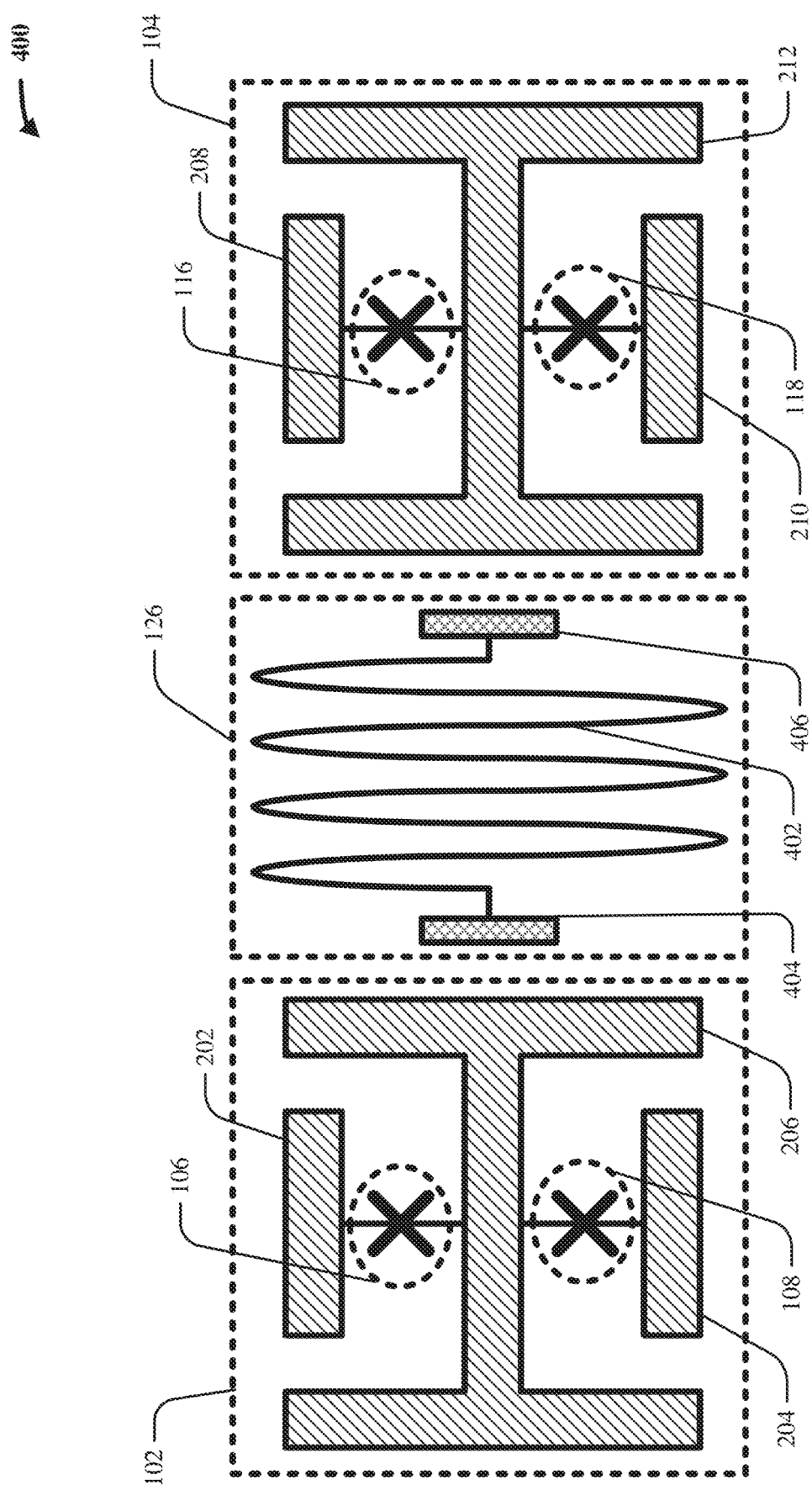
FIG. 4 illustrates a block diagram of an example, non-limiting system that facilitates dark mode coupling between superconducting qubits in accordance with one or more embodiments described herein.

FIG. 4 illustrates a block diagram of an example, non-limiting system 400 that can facilitate dark mode coupling between superconducting qubits in accordance with one or more embodiments described herein. In various aspects, FIG. 4 can illustrate a physical structure/architecture that can implement the circuit depicted in FIG. 3.

In various aspects, the system 400 can comprise the two-junction transmon qubit 102 and the two-junction transmon qubit 104, as described above, which can be coupled together by the mode-selective coupler 126 as shown in FIG. 3. As explained above, FIG. 3 depicts a circuit diagram of the two-junction transmon qubit 102, the two-junction transmon qubit 104, and a non-limiting embodiment of the mode-selective coupler 126. FIG. 4, on the other hand, depicts physical structures and/or architectures that can be used to implement the two-junction transmon qubit 102, the two-junction transmon qubit 104, and that non-limiting embodiment of the mode-selective coupler 126.

In various embodiments, as shown, the mode-selective coupler 126 can comprise a bus resonator 402, a capacitor pad 404, and a capacitor pad 406. In various aspects, the bus resonator 402 can be any suitable bus resonator and/or other meandering/coiling transmission line, which can function as the coplanar waveguide 302. In various instances, the bus resonator 402 can comprise any suitable shape, dimensions, and/or materials. In various cases, as shown, the bus resonator 402 can be capped by the capacitor pad 404 and the capacitor pad 406, which themselves can comprise any suitable shapes, dimensions, and/or materials. In various cases, the capacitor pad 404 can be in any suitable proximity to the middle capacitor pad 206, such that the capacitor pad 404 and the middle capacitor pad 206 have a capacitive interaction. In other words, the capacitor pad 404 and the middle capacitor pad 206 can be considered as collectively forming the capacitor 304. Similarly, in various aspects, the capacitor pad 406 can be in any suitable proximity to the middle capacitor pad 212, such that the capacitor pad 406 and the middle capacitor pad 212 have a capacitive interaction. So, the capacitor pad 406 and the middle capacitor pad 212 can be considered as collectively forming the capacitor 306. In any case, the non-limiting structure of the mode-selective coupler 126 shown in FIG. 4 can cause the dark mode of the two-junction transmon qubit 102 to couple to the dark mode of the two-junction transmon qubit 104, and can prevent the bright mode of the two-junction transmon qubit 102 from coupling to the bright mode of the two-junction transmon qubit 104.

FIG. 5 illustrates example, non-limiting graphs 500 showing how entanglement can be facilitated by dark mode coupling between superconducting qubits in accordance with one or more embodiments described herein.

As shown, FIG. 5 includes a graph 502 and a graph 504. The inventors of various embodiments described herein constructed a superconducting qubit architecture according to FIGS. 1-2 and performed Ramsey experiments on such superconducting qubit architecture, the results of which are shown in the graph 502 and the graph 504. More specifically, the inventors constructed an embodiment of the two-junction transmon qubit 102, the two-junction transmon qubit 104, and the mode-selective coupler 126 as shown in FIGS. 1-2. The inventors conducted Ramsey experiments on the bright mode of the two-junction transmon qubit 104 (e.g., the target qubit) when the two-junction transmon qubit 102 (e.g., the control qubit) was encoded in its bright mode, and the results of such Ramsey experiments are shown in the graph 502. Moreover, the inventors conducted Ramsey experiments on the bright mode of the two-junction transmon qubit 104 (e.g., the target qubit) when the two-junction transmon qubit 102 (e.g., the control qubit) was instead encoded in its dark mode, and the results of such Ramsey experiments are shown in the graph 504.

Consider the graph 502. The graph 502 illustrates the oscillatory behavior of the bright mode of the two-junction transmon qubit 104 (e.g., target qubit), in response to excitation and/or de-excitation of the bright mode of the two-junction transmon qubit 102 (e.g., control qubit). Specifically, the green curve in the graph 502 represents the Z-rotations of the bright mode of the two-junction transmon qubit 104 (e.g., target qubit) when the two-junction transmon qubit 102 (e.g., control qubit) is initialized in its bright mode ground state. In contrast, the red curve in the graph 502 represents the Z-rotations of the bright mode of the two-junction transmon qubit 104 (e.g., target qubit) when the two-junction transmon qubit 102 (e.g., control qubit) is initialized in its bright mode excited state. As shown, the green curve and the red curve in the graph 502 are essentially on top of each other and/or identical. That is, there is no change in the oscillatory behavior of the bright mode of the two-junction transmon qubit 104 (e.g., target qubit) in response to changes in the state of the bright mode of the two-junction transmon qubit 102 (e.g., control qubit). In other words, the bright mode of the two-junction transmon qubit 104 (e.g., target qubit) is independent of and/or otherwise not coupled to the bright mode of the two-junction transmon qubit 102 (e.g., control qubit). As explained above, this uncoupling between the bright modes can be considered as a result caused by the mode-selective coupler 126.

Now, consider the graph 504. The graph 504 illustrates the oscillatory behavior of the bright mode of the two-junction transmon qubit 104 (e.g., target qubit), in response to excitation and/or de-excitation of the dark mode of the two-junction transmon qubit 102 (e.g., control qubit). Specifically, the green curve in the graph 504 represents the Z-rotations of the bright mode of the two-junction transmon qubit 104 (e.g., target qubit) when the two-junction transmon qubit 102 (e.g., control qubit) is initialized in its dark mode ground state. In contrast, the red curve in the graph 504 represents the Z-rotations of the bright mode of the two-junction transmon qubit 104 (e.g., target qubit) when the two-junction transmon qubit 102 (e.g., control qubit) is instead initialized in its dark mode excited state. As shown, the green curve and the red curve in the graph 504 are significantly different. Indeed, the frequency of the green curve is about 1 mega-Hertz different from the frequency of the red curve. That is, there is a significant change in the oscillatory behavior of the bright mode of the two-junction transmon qubit 104 (e.g., target qubit) in response to changes in the state of the dark mode of the two-junction transmon qubit 102 (e.g., control qubit). In other words, the bright mode of the two-junction transmon qubit 104 (e.g., target qubit) is not independent of the dark mode of the two-junction transmon qubit 102 (e.g., control qubit). In various cases, this bright-dark coupling can be considered as a result caused by the mode-selective coupler 126.

In various cases, the difference in frequency between the green curve and the red curve of the graph 504 can be considered as a static ZZ interaction that occurs between the two-junction transmon qubit 102 and the two-junction transmon qubit 104 due to the mode-selective coupler 126. As those having ordinary skill in the art will appreciate, a ZZ interaction can be considered as a type of interaction between two qubits or modes, in which the excitation of one qubit or mode causes a shift in the transition frequency of the other qubit or mode. As those having ordinary skill in the art will further appreciate, a static ZZ interaction can be considered as a ZZ interaction that is present between two qubits or modes in the absence of an external microwave driving signal. Thus, the graph 504 shows that a static ZZ interaction exists between the bright mode of the two-junction transmon qubit 104 (e.g., target qubit) and the dark mode of the two-junction transmon qubit 102 (e.g., control qubit), when the two-junction transmon qubit 104 (e.g., target qubit) and the two-junction transmon qubit 102 (e.g., target qubit) are coupled via the mode-selective coupler 126. As explained herein, the inventors of various embodiments of the invention recognized that this static ZZ interaction can be leveraged to create low-power and spatially-efficient entanglement between the two-junction transmon qubit 104 (e.g., target qubit) and the two-junction transmon qubit 102 (e.g., control qubit).

Although the graphs 502-504 were created based on embodiments of the invention that are in accordance with FIGS. 1-2, those having ordinary skill in the art will appreciate that analogous experimentation results can be obtained for embodiments of the invention that are in accordance with FIGS. 3-4.

Figure 6:
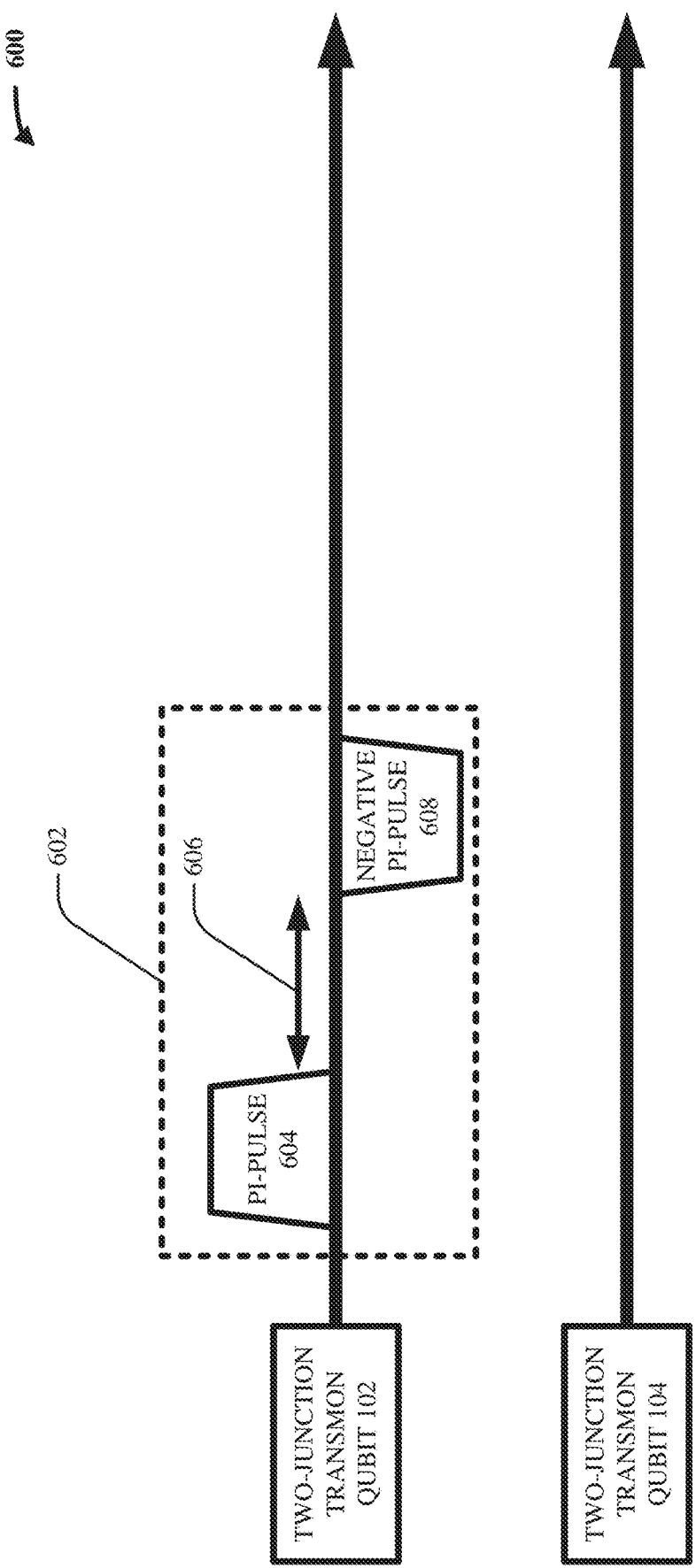
FIG. 6 illustrates an example, non-limiting quantum circuit diagram showing a dark mode excitation pulse sequence for facilitating entanglement between superconducting qubits in accordance with one or more embodiments described herein.

FIG. 6 illustrates an example, non-limiting quantum circuit diagram 600 showing a dark mode excitation pulse sequence for facilitating entanglement between superconducting qubits in accordance with one or more embodiments described herein.

In various embodiments, FIG. 6 illustrates a dark mode excitation pulse sequence 602. In various aspects, as shown, the dark mode excitation pulse sequence 602 can comprise a pi-pulse 604, an idle time 606, and/or a negative pi-pulse 608. In various instances, the pi-pulse 604 can be any suitable qubit control signal (e.g., a microwave driving signal) that is configured to switch the two-junction transmon qubit 102 (e.g., control qubit) from a dark mode ground state to a dark mode excited state. That is, the amplitude and/or phase of the pi-pulse 604 can have any suitable values, and the frequency of the pi-pulse 604 can match and/or be within any suitable threshold margin of the dark mode transition frequency of the two-junction transmon qubit 102 (e.g., control qubit). In other words, the pi-pulse 604 can be considered as exciting the dark mode of the two-junction transmon qubit 102 (e.g., control qubit). In various cases, the idle time 606 can have any suitable duration (e.g., seconds, milliseconds, microseconds, nanoseconds), during which no pulses and/or drive signals are applied to the two-junction transmon qubit 102 (e.g., control qubit) and/or to the two-junction transmon qubit 104 (e.g., target qubit). In various aspects, the negative pi-pulse 608 can be any suitable qubit control signal (e.g., a microwave driving signal) that is configured to switch the two-junction transmon qubit 102 (e.g., control qubit) from a dark mode excited state to a dark mode ground state. That is, the amplitude and/or phase of the negative pi-pulse 608 can have any suitable values, and the frequency of the negative pi-pulse 608 can match and/or be within any suitable threshold margin of the dark mode transition frequency of the two-junction transmon qubit 102 (e.g., control qubit). In other words, the negative pi-pulse 608 can be considered as de-exciting the dark mode of the two-junction transmon qubit 102 (e.g., control qubit)

In various aspects, due to the bright-dark coupling shown in the graph 504, application of the dark mode excitation pulse sequence 602 can cause state-dependent oscillations in both the two-junction transmon qubit 102 (e.g., control qubit) and the two-junction transmon qubit 104 (e.g., target qubit), notwithstanding that the dark mode excitation pulse sequence 602 can lack pulses that are directly applied to the two-junction transmon qubit 104 (e.g., target qubit). That is, application of the dark mode excitation pulse sequence 602 can be considered as equivalent to application of an entangling gate on the two-junction transmon qubit 102 (e.g., control qubit) and the two-junction transmon qubit 104 (e.g., target qubit).

As those having ordinary skill in the art will appreciate, the characteristics of the dark mode excitation pulse sequence 602 can be controlled, so as to correspondingly control the type of entangling gate that is implemented by the dark mode excitation pulse sequence 602. More specifically, the amplitude and/or phase of the pi-pulse 604, the amplitude and/or phase of the negative pi-pulse 608, and/or the length of the idle time 606 can be adjusted, so as to commensurately adjust the resultant entangling gate that is implemented by the dark mode excitation pulse sequence 602. For example, the length of the idle time 606, the amplitude/phase of the pi-pulse 604, and/or the amplitude/phase of the negative pi-pulse 608 can be adjusted to particular values, such that the dark mode excitation pulse sequence 602 implements a particular entangling gate (e.g., a controlled-phase gate). As another example, the length of the idle time 606, the amplitude/phase of the pi-pulse 604, and/or the amplitude/phase of the negative pi-pulse 608 can be adjusted to different values, such that the dark mode excitation pulse sequence 602 implements a different entangling gate (e.g., a controlled-not gate). As yet another example, the length of the idle time 606, the amplitude/phase of the pi-pulse 604, and/or the amplitude/phase of the negative pi-pulse 608 can be adjusted to still different values, such that the dark mode excitation pulse sequence 602 implements a still different entangling gate (e.g., a controlled-Z gate). Those having ordinary skill in the art will appreciate how to controllably modulate the amplitude, phase, and/or idle time of the dark mode excitation pulse sequence 602 so as to control the type of entangling gate implemented by the dark mode excitation pulse sequence 602.

Note that the pi-pulse 604 can be considered as a single-qubit pulse and/or a single-qubit gate, since the pi-pulse 604 is applied only to the two-junction transmon qubit 102 (e.g., control qubit) and not to the two-junction transmon qubit 104 (e.g., target qubit). Similarly, note that the negative pi-pulse 608 can also be considered as a single-qubit pulse and/or a single-qubit gate, since the negative pi-pulse 608 is applied only to the two-junction transmon qubit 102 (e.g., control qubit) and not to the two-junction transmon qubit 104 (e.g., target qubit). Accordingly, the dark mode excitation pulse-sequence 602 can consume an amount of energy that is comparable to and/or on the order of an amount of energy that would be consumed by two single-qubit gates. However, when used in conjunction with the mode-selective coupler 126, the dark mode excitation pulse sequence 602 can cause controlled entanglement between the two-junction transmon qubit 102 (e.g., control qubit) and the two-junction transmon qubit 104 (e.g., target qubit). In other words, the dark mode excitation pulse sequence 602 can be considered as an entangling gate that consumes the same amount of energy as two single-qubit gates. This is a notable improvement, since existing techniques for generating entangling gates consume far more energy than two single-qubit gates consume. Indeed, as experimentally verified by the inventors of various embodiments described herein, the dark mode excitation pulse sequence 602 can consume an order of magnitude less energy (e.g., 10 times less energy) as compared to existing entanglement techniques. Moreover, note that the dark mode excitation pulse sequence 602 can be implemented in the absence of (e.g., without utilizing) flux-tunable buses. Accordingly, the dark mode excitation pulse sequence 602 can be implemented using far more spatially-efficient architectures, as compared to existing entangling techniques.

FIG. 7 illustrates example, non-limiting graphs 700 showing how entanglement can be facilitated by a dark mode excitation pulse sequence in accordance with one or more embodiments described herein.

As shown, FIG. 7 includes a graph 702 and a graph 704. The inventors of various embodiments described herein constructed an embodiment of the two-junction transmon qubit 102, the two-junction transmon qubit 104, and the mode-selective coupler 126 as shown in FIGS. 1-2. The inventors calibrated an embodiment of the dark mode excitation pulse sequence 602, so as to implement a controlled-phase gate. Moreover, the inventors applied the dark mode excitation pulse sequence 602 to the two-junction transmon qubit 102 (e.g., control qubit) and measured, via Ramsey experiments, the dark mode of the two-junction transmon qubit 102 (e.g., control qubit), the results of which are shown in the graph 702. Furthermore, the inventors applied the dark mode excitation pulse sequence 602 to the two-junction transmon qubit 102 (e.g., control qubit) and measured, via Ramsey experiments, the bright mode of the two-junction transmon qubit 104 (e.g., target qubit), the results of which are shown in the graph 704.

Consider the graph 702. The graph 702 illustrates the oscillatory behavior of the dark mode of the two-junction transmon qubit 102 (e.g., control qubit), in response to the dark mode excitation pulse sequence 602, and in response to initial excitation and/or de-excitation of the bright mode of the two-junction transmon qubit 104 (e.g., target qubit). Specifically, the red curve in the graph 702 represents the Z-rotations of the dark mode of the two-junction transmon qubit 102 (e.g., control qubit) after application of the dark mode excitation pulse sequence 602, when the two-junction transmon qubit 104 (e.g., target qubit) is initialized in its bright mode ground state. In contrast, the green curve in the graph 702 represents the Z-rotations of the dark mode of the two-junction transmon qubit 102 (e.g., control qubit) after application of the dark mode excitation pulse sequence 602, when the two-junction transmon qubit 104 (e.g., target qubit) is initialized in its bright mode excited state.

Now, consider the graph 704. The graph 704 illustrates the oscillatory behavior of the bright mode of the two-junction transmon qubit 104 (e.g., target qubit), in response to the dark mode excitation pulse sequence 602, and in response to initial excitation and/or de-excitation of the dark mode of the two-junction transmon qubit 102 (e.g., control qubit). Specifically, the red curve in the graph 704 represents the Z-rotations of the bright mode of the two-junction transmon qubit 104 (e.g., target qubit) after application of the dark mode excitation pulse sequence 602, when the two-junction transmon qubit 102 (e.g., control qubit) is initialized in its dark mode ground state. In contrast, the green curve in the graph 704 represents the Z-rotations of the bright mode of the two-junction transmon qubit 104 (e.g., target qubit) after application of the dark mode excitation pulse sequence 602, when the two-junction transmon qubit 102 (e.g., control qubit) is initialized in its dark mode excited state.

As can be seen from the graph 702 and the graph 704, application of the dark mode excitation pulse sequence 602 in the presence of the mode-selective coupler 126 can cause state-dependent Ramsey oscillations in the two-junction transmon qubit 102 (e.g., control qubit) and the two-junction transmon qubit 104 (e.g., target qubit). That is, application of the dark mode excitation pulse sequence 602 in the presence of the mode-selective coupler 126 can cause controlled entanglement between the two-junction transmon qubit 102 (e.g., control qubit) and the two-junction transmon qubit 104 (e.g., target qubit).

Figure 8:
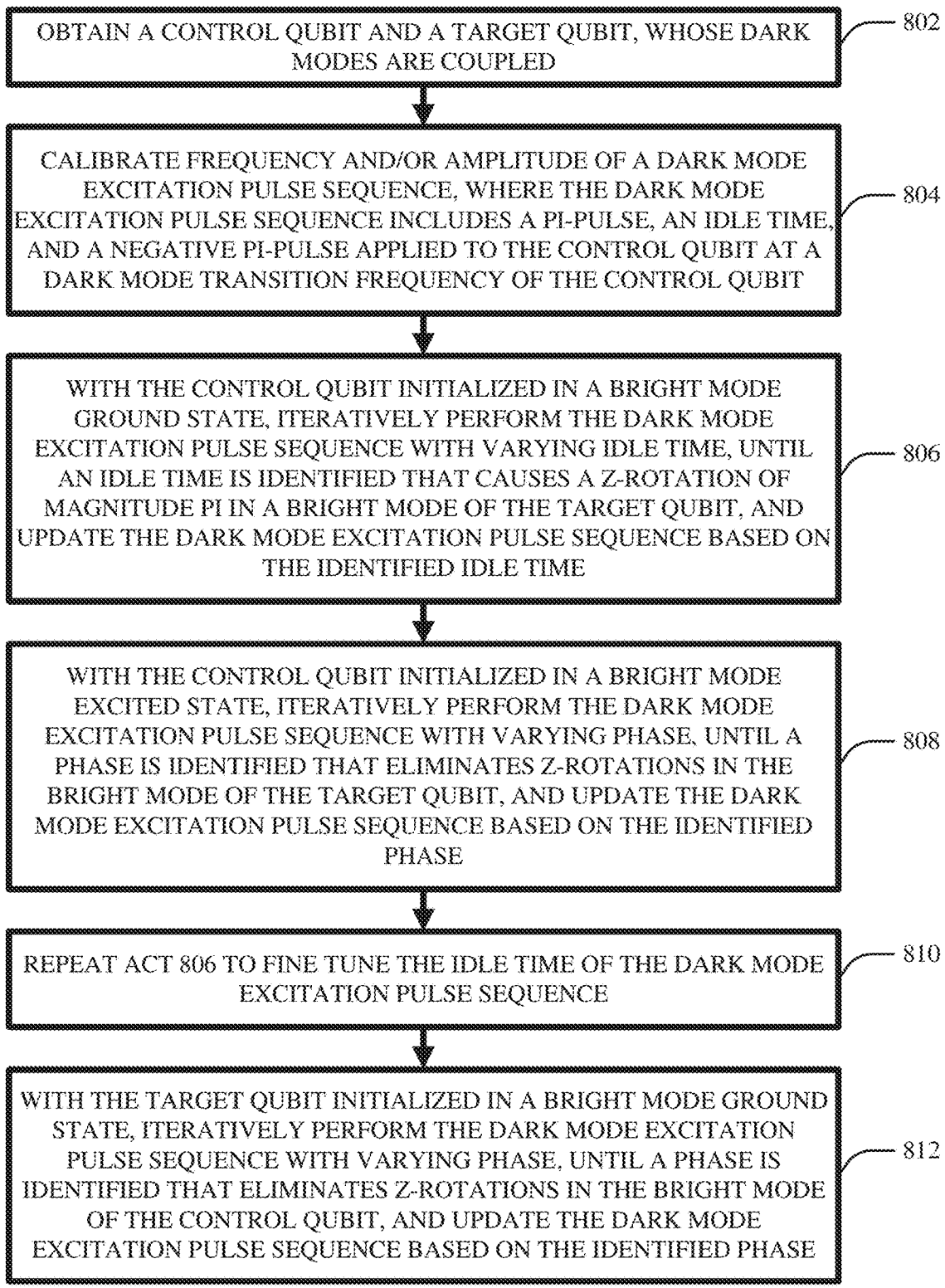
FIG. 8 illustrates a flow diagram of an example, non-limiting method for calibrating a dark mode excitation pulse sequence in accordance with one or more embodiments described herein.

FIG. 8 illustrates a flow diagram of an example, non-limiting method 800 for calibrating a dark mode excitation pulse sequence in accordance with one or more embodiments described herein. That is, the method 800 can be considered as a calibration procedure that can controllably alter the dark mode excitation pulse sequence 602, so as to cause the dark mode excitation pulse sequence 602 to implement a desired entangling gate.

In various embodiments, act 802 can include obtaining a control qubit (e.g., 102) and a target qubit (e.g., 104), whose dark modes are coupled (e.g., via 126).

In various aspects, act 804 can include calibrating the frequency and/or amplitude of a dark mode excitation pulse sequence (e.g., 602), where the dark mode excitation pulse sequence includes a pi-pulse (e.g., 604), an idle time (e.g., 606), and a negative pi-pulse (e.g., 608) at a dark mode transition frequency of the control qubit. In various cases, any suitable calibration techniques can be utilized to set the frequency and/or amplitude of the pi-pulse and/or the negative pi-pulse, and thus of the dark mode excitation pulse sequence.

In various instances, act 806 can include, with the control qubit initialized in a bright mode ground state, iteratively performing the dark mode excitation pulse sequence with varying idle time, until an idle time is identified that causes a Z-rotation of magnitude pi (e.g., measured in radians) in a bright mode of the target qubit. In various cases, act 806 can further include updating the dark mode excitation pulse sequence based on the identified idle time (e.g., adjusting the idle time of the dark mode excitation pulse sequence to match the identified idle time). In various cases, act 806 can be considered as roughly calibrating the idle time of the dark mode excitation pulse sequence.

In various aspects, act 808 can include, with the control qubit initialized in a bright mode excited state, iteratively performing the dark mode excitation pulse sequence with varying phase, until a phase is identified that eliminates Z-rotations in the bright mode of the target qubit. In various cases, act 808 can further include updating the dark mode excitation pulse sequence based on the identified phase (e.g., adjusting the phase of the pi-pulse and/or the negative pi-pulse to match the identified phase). In various cases, as those having ordinary skill in the art will appreciate, such phase modulation can be considered as a frame change (e.g., a virtual phase-shift of a qubit by adjusting the phase of its control signal, which can be considered as equivalent to rotating the qubit around its Z-axis). As those having ordinary skill in the art will appreciate, act 808 can be considered as eliminating an IZ error of the dark mode excitation pulse sequence.

In various instances, act 810 can include repeating act 806 to fine tune the idle time of the dark mode excitation pulse sequence.

In various aspects, act 812 can include, with the target qubit initialized in a bright mode ground state, iteratively performing the dark mode excitation pulse sequence with varying phase, until a phase is identified that eliminates Z-rotations in the bright mode of the control qubit. In various cases, act 812 can further include updating the dark mode excitation pulse sequence based on the identified phase (e.g., adjusting the phase of the pi-pulse and/or the negative pi-pulse to match the identified phase). As those having ordinary skill in the art will appreciate, act 812 can be considered as eliminating a ZI error of the dark mode excitation pulse sequence.

Although not explicitly shown in FIG. 8, those having ordinary skill in the art will appreciate that any other suitable phase changes, idle time changes, and/or amplitude changes can be implemented, so as to cause the dark mode excitation pulse sequence to implement any suitable entangling gate as desired.

Those having ordinary skill in the art will appreciate that the method 800 can only be performed by quantum hardware and cannot be performed by a human being without quantum hardware.

The inventors of various embodiments described herein calibrated a non-limiting embodiment of the dark mode excitation pulse sequence 602 according to the method 800, so that the dark mode excitation pulse sequence 602 was configured to implement a controlled-phase gate (e.g., having an idle time of about 425 nanoseconds). The inventors then conducted randomized benchmarking on the dark mode excitation pulse sequence, which showed an entangling gate error of about 2% to 3%, which is comparable to early demonstrations of other entangling gates for superconducting qubits.

Figure 9:
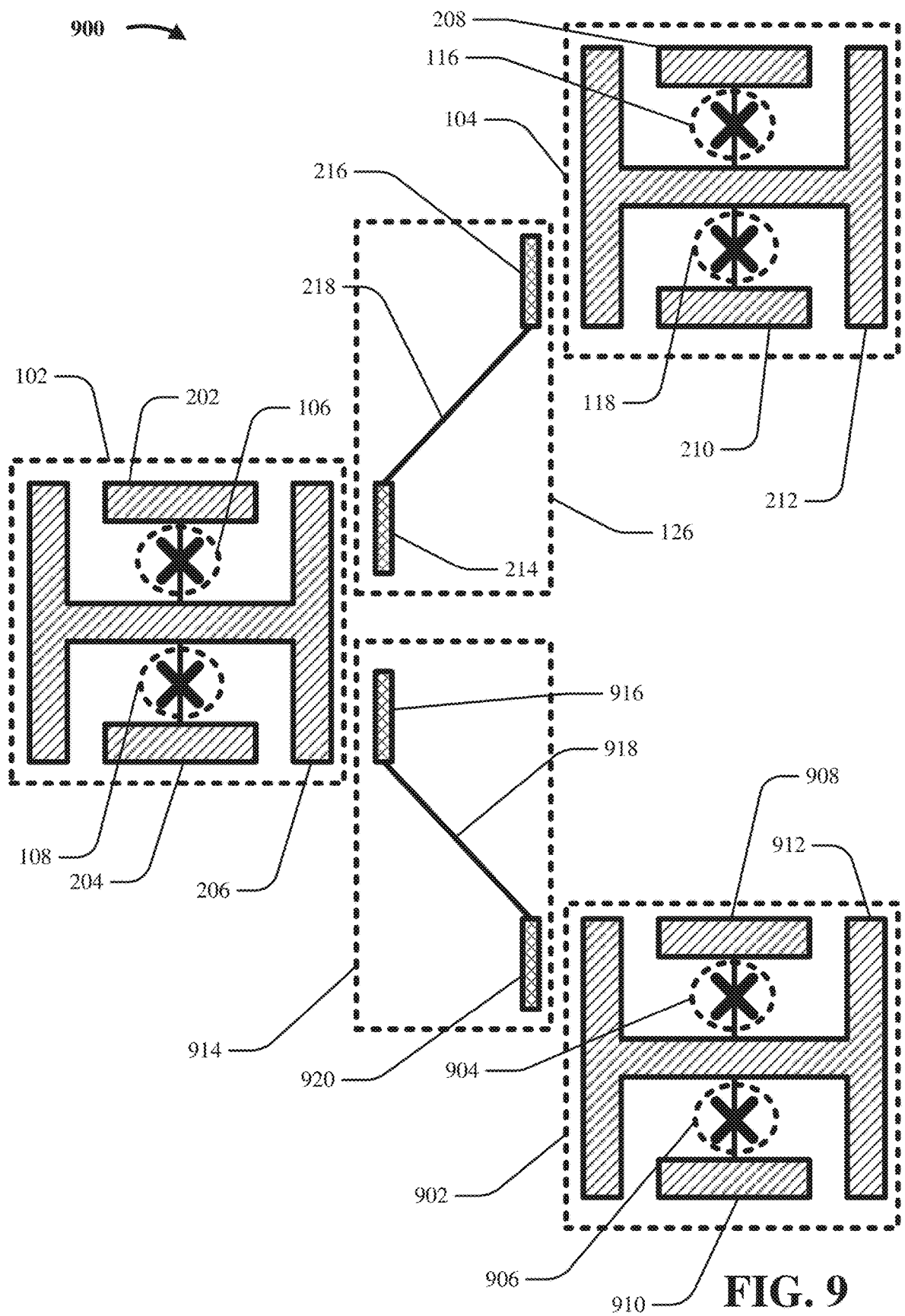
FIG. 9 illustrates a block diagram of an example, non-limiting system that facilitates dark mode coupling with a spectator qubit in accordance with one or more embodiments described herein.

FIG. 9 illustrates a block diagram of an example, non-limiting system 900 that can facilitate dark mode coupling with a spectator qubit in accordance with one or more embodiments described herein. In practice, it can be desirable to implement more than just two superconducting qubits in a quantum computer. Indeed, rather than just two superconducting qubits, it can be desirable to implement a lattice of multiple superconducting qubits, where each superconducting qubit in the lattice is coupled to multiple neighboring qubits. In various cases, FIG. 9 shows a non-limiting example of a control qubit, a target qubit, and a spectator qubit that is coupled to the control qubit.

As shown, FIG. 9 depicts the two-junction transmon qubit 102, which can comprise the Josephson junction 106, the Josephson junction 108, the end capacitor pad 202, the end capacitor pad 204, and the middle capacitor pad 206. As also shown, FIG. 9 depicts the two-junction transmon qubit 104, which can comprise the Josephson junction 116, the Josephson junction 118, the end capacitor pad 208, the end capacitor pad 210, and the middle capacitor pad 212. Additionally, as shown, FIG. 9 depicts the mode-selective coupler 126 that couples the middle capacitor pad 206 to the middle capacitor pad 212, comprising the capacitor pad 214, the capacitor pad 216, and the transmission line 218.

In various embodiments, there can be a two-junction transmon qubit 902. In various aspects, the two-junction transmon qubit 902 can comprise a Josephson junction 904, a Josephson junction 906, an end capacitor pad 908, an end capacitor pad 910, and a middle capacitor pad 912, much as described above. So, the two-junction transmon qubit 902 can have its own dark mode and bright mode. In various instances, the two-junction transmon qubit 104 can be coupled to the two-junction transmon qubit 902 via a mode-selective coupler 914. As shown, the mode-selective coupler 914 can comprise a capacitor pad 916, a capacitor pad 920, and a transmission line 918, much as described above with respect to the mode-selective coupler 126. Accordingly, the mode-selective coupler 914 can cause the dark mode of the two-junction transmon qubit 102 to be coupled to the dark mode of the two-junction transmon qubit 902, and can prevent the bright mode of the two-junction transmon qubit 102 from being coupled to the bright mode of the two-junction transmon qubit 902.

With this architecture, it can be desired to facilitate entanglement between the two-junction transmon qubit 102 (e.g., control qubit) and the two-junction transmon qubit 104 (e.g., target qubit). In such case, the two-junction transmon qubit 902 can be considered as a spectator qubit. In various instances, when the dark mode excitation pulse sequence 602 is applied to facilitate entanglement between the two-junction transmon qubit 102 (e.g., control qubit) and the two-junction transmon qubit 104 (e.g., target qubit), the two-junction transmon qubit 902 (e.g., spectator qubit) can affect and/or be affected by such entanglement. Indeed, this is shown with to FIG. 10.

Figure 10:
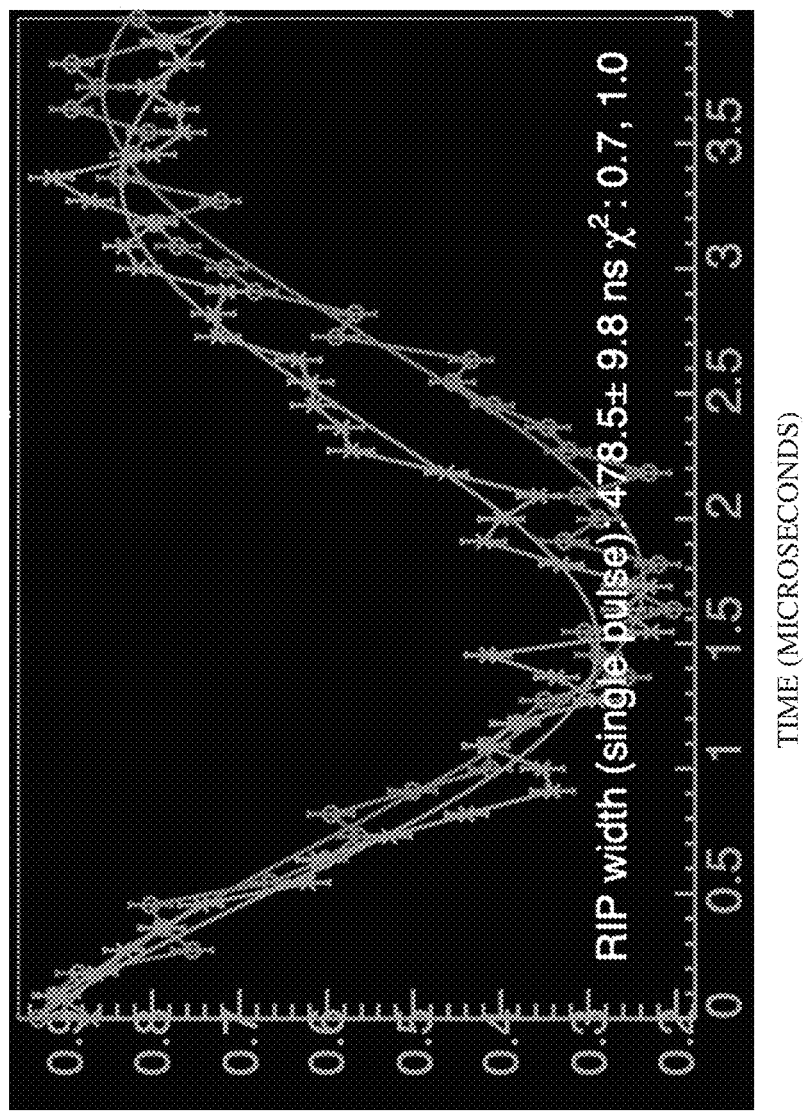
FIG. 10 illustrates an example, non-limiting graph showing how a spectator qubit can influence a target qubit when a dark mode excitation pulse sequence is applied in accordance with one or more embodiments described herein.

FIG. 10 illustrates an example, non-limiting graph 1000 showing how a spectator qubit can influence a target qubit when a dark mode excitation pulse sequence is applied in accordance with one or more embodiments described herein.

Specifically, the inventors of various embodiments described herein constructed the superconducting qubit architecture depicted in FIG. 9. That is, the inventors constructed the two-junction transmon qubit 102, the two-junction transmon qubit 104, the two-junction transmon qubit 902, the mode-selective coupler 126, and the mode-selective coupler 914. Moreover, the inventors applied the dark mode excitation pulse sequence 602 so as to entangle the two-junction transmon qubit 102 (e.g., control qubit) with the two-junction transmon qubit 104 (e.g., target qubit) and measured, via Ramsey experiments, the bright mode of the two-junction transmon qubit 104 (e.g., target qubit) when the two-junction transmon qubit 902 (e.g., spectator qubit) was encoded in its bright mode, the results of which are shown in the graph 1000. More specifically, the green curve represents the oscillatory behavior (e.g., Z oscillations) of the bright mode of the two-junction transmon qubit 104 (e.g., target qubit) in response to the dark mode excitation pulse sequence 602, when the two-junction transmon qubit 902 (e.g., spectator qubit) is initialized in a bright mode ground state. In contrast, the red curve represents the oscillatory behavior (e.g., Z oscillations) of the bright mode of the two-junction transmon qubit 104 (e.g., target qubit) in response to the dark mode excitation pulse sequence 602, when the two-junction transmon qubit 902 (e.g., spectator qubit) is initialized in a bright mode excited state. As can be seen, there is a significant difference between the green curve and the red curve (e.g., they are not essentially on top of each other), indicating that the oscillatory response of the two-junction transmon qubit 104 (e.g., target qubit) is not independent of the state of the two-junction transmon qubit 902 (e.g., spectator qubit). In various cases, the inventors devised a solution to this problem, which is explained with respect to FIG. 11.

Figure 11:
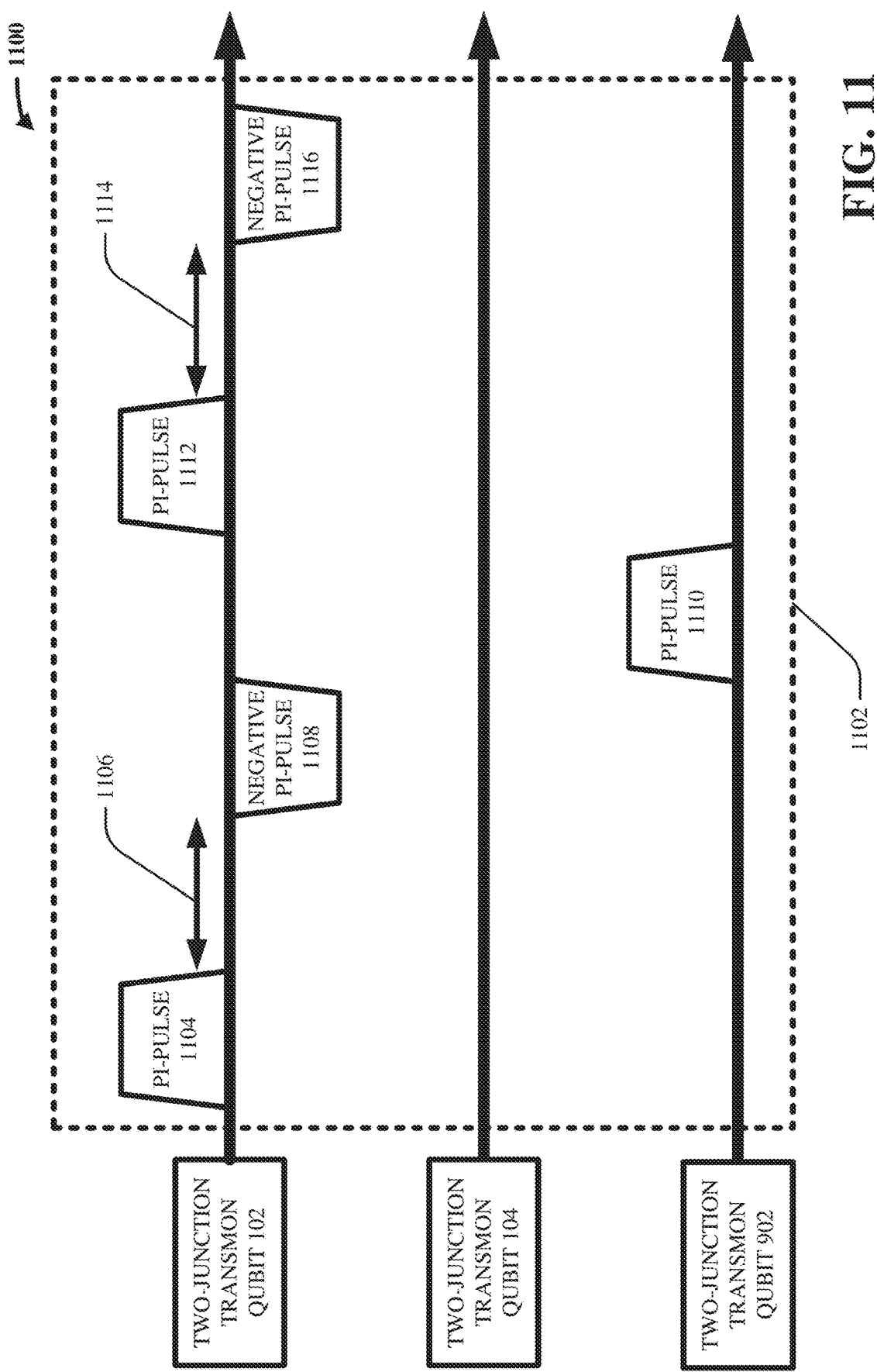
FIG. 11 illustrates an example, non-limiting quantum circuit diagram showing an echoed dark mode excitation pulse sequence for facilitating entanglement between superconducting qubits in accordance with one or more embodiments described herein.

FIG. 11 illustrates an example, non-limiting quantum circuit diagram 1100 showing an echoed dark mode excitation pulse sequence for facilitating entanglement between superconducting qubits in accordance with one or more embodiments described herein.

In various embodiments, FIG. 11 illustrates an echoed dark mode excitation pulse sequence 1102. In various aspects, as shown, the echoed dark mode excitation pulse sequence 1102 can comprise a pi-pulse 1104, an idle time 1106, a negative pi-pulse 1108, a pi-pulse 1110, a pi-pulse 1112, an idle time 1114, and a negative pi-pulse 1116. In various instances, the pi-pulse 1104 can be any suitable qubit control signal (e.g., a microwave driving signal) that is configured to switch the two-junction transmon qubit 102 (e.g., control qubit) from a dark mode ground state to a dark mode excited state. That is, the amplitude and/or phase of the pi-pulse 1104 can have any suitable values, and the frequency of the pi-pulse 1104 can match and/or be within any suitable threshold margin of the dark mode transition frequency of the two-junction transmon qubit 102 (e.g., control qubit). In various cases, the idle time 1106 can have any suitable duration (e.g., seconds, milliseconds, microseconds, nanoseconds), during which no pulses and/or drive signals are applied to the two-junction transmon qubit 102 (e.g., control qubit) and/or to any other qubits in the system (e.g., 104 and/or 902). In various aspects, the negative pi-pulse 1108 can be any suitable qubit control signal (e.g., a microwave driving signal) that is configured to switch the two-junction transmon qubit 102 (e.g., control qubit) from a dark mode excited state to a dark mode ground state. That is, the amplitude and/or phase of the negative pi-pulse 1108 can have any suitable values, and the frequency of the negative pi-pulse 1108 can match and/or be within any suitable threshold margin of the dark mode transition frequency of the two-junction transmon qubit 102 (e.g., control qubit). In various instances, the pi-pulse 1110 can be any suitable qubit control signal (e.g., a microwave driving signal) that is configured to switch the two-junction transmon qubit 902 (e.g., spectator qubit) from a bright mode ground state to a bright mode excited state, and/or vice versa. That is, the amplitude and/or phase of the pi-pulse 1110 can have any suitable values, and the frequency of the pi-pulse 1110 can match and/or be within any suitable threshold margin of the bright mode transition frequency of the two-junction transmon qubit 902 (e.g., spectator qubit). In various embodiments, the pi-pulse 1112 can be a copy and/or duplicate of the pi-pulse 1104, the idle time 1114 can be a copy and/or duplicate of the idle time 1106, and the negative pi-pulse 1116 can be a copy and/or duplicate of the negative pi-pulse 1108.

In various aspects, application of the echoed dark mode excitation pulse sequence 1102 can cause state-dependent oscillations in both the two-junction transmon qubit 102 (e.g., control qubit) and the two-junction transmon qubit 104 (e.g., target qubit), while preventing the two-junction transmon qubit 902 from affecting and/or being affected by such state-dependent oscillations. More specifically, the pi-pulse 1110 can be considered as eliminating the effects of the entangled response between the two-junction transmon qubit 102 (e.g., control qubit) and the two-junction transmon qubit 104 (e.g., target qubit) on the two-junction transmon qubit 902 (e.g., spectator qubit). Moreover, the pi-pulse 1110 can also be considered as subtracting out the effects of two-junction transmon qubit 902 (e.g., spectator qubit) on the entangled response between the two-junction transmon qubit 102 (e.g., control qubit) and the two-junction transmon qubit 104 (e.g., target qubit). Accordingly, application of the echoed dark mode excitation pulse sequence 1102 can be considered as equivalent to application of an entangling gate on the two-junction transmon qubit 102 (e.g., control qubit) and the two-junction transmon qubit 104 (e.g., target qubit), which entangling gate does not affect and is unaffected by the two-junction transmon qubit 902 (e.g., spectator qubit). In some cases, the echoed dark mode excitation pulse sequence 1102 can be considered as applying a first half of an entangling gate (e.g., represented by 1104-1108), isolating the effects of the spectator qubit (e.g., via 1110), and applying a second half of the entangling gate (e.g., represented by 1112-1116).

As those having ordinary skill in the art will appreciate, the characteristics of the echoed dark mode excitation pulse sequence 1102 can be controlled, so as to correspondingly control the type of entangling gate that is implemented by the echoed dark mode excitation pulse sequence 1102, in similar fashion as described above with respect to the dark mode excitation pulse sequence 602. Indeed, in various cases, the method 800 can be adapted to calibrate the echoed dark mode excitation pulse sequence 1102 (e.g., replace "dark mode excitation pulse sequence" in the method 800 with "echoed dark mode excitation pulse sequence").

Just as with the dark mode excitation pulse sequence 602, the echoed dark mode excitation pulse sequence 1102 can consume about an order of magnitude less energy as compared to existing entangling techniques and does not require flux-tunable buses.

Although FIG. 11 illustrates only one echoed pi-pulse (e.g., 1110), this is a mere non-limiting example. Those having ordinary skill in the art will appreciate that one echo pi-pulse (e.g., 1110) can be implemented for each spectator qubit (e.g., 902) that is coupled to a control qubit (e.g., 102). That is, if there are n qubits coupled to a control qubit, for any suitable positive integer n, and if only one of those n qubits is a target qubit, then there are n−1 spectator qubits, and so the echoed dark mode excitation pulse sequence 1102 can include n−1 echoed pi-pulses (e.g., each echoed pi-pulse can be applied to a respectively corresponding spectator qubit, so as to isolate that spectator qubit).

Figure 12:
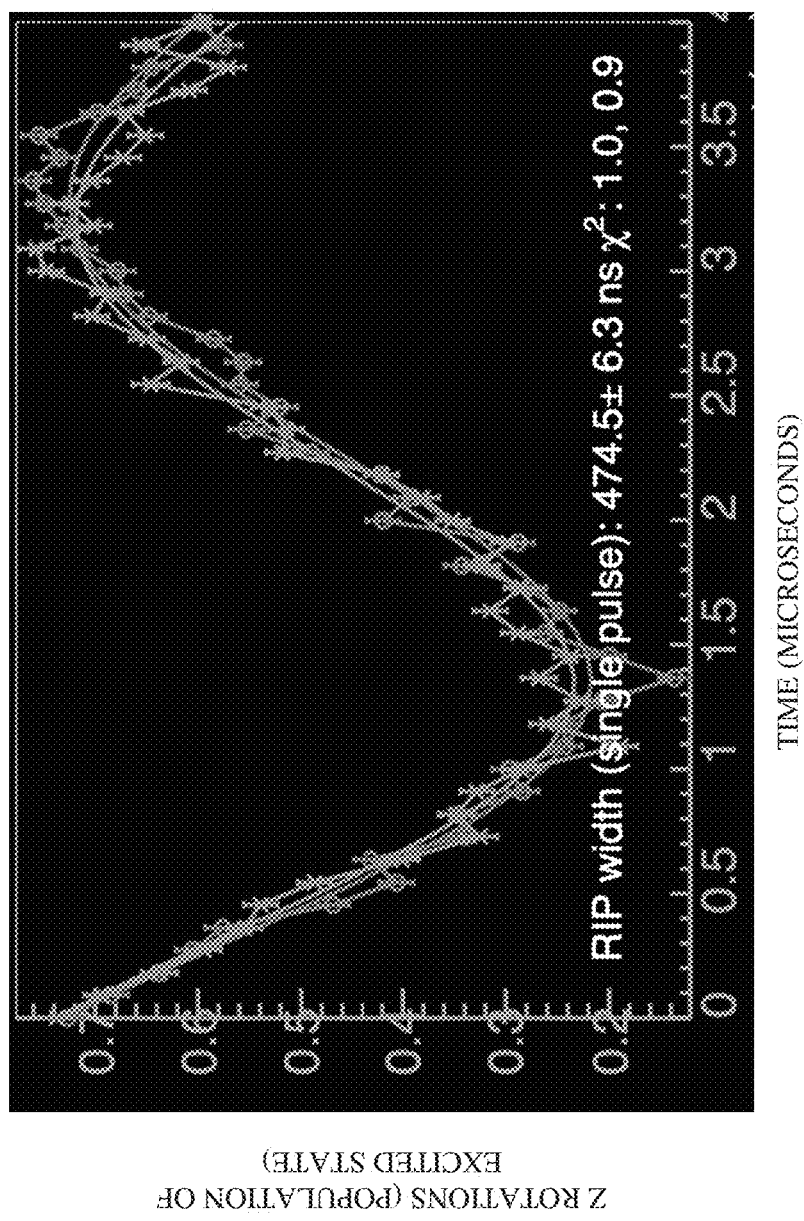
FIG. 12 illustrates an example, non-limiting graph showing how a spectator qubit can be insulated from a target qubit when an echoed dark mode excitation pulse sequence is applied in accordance with one or more embodiments described herein.

FIG. 12 illustrates an example, non-limiting graph 1200 showing how a spectator qubit can be insulated from a target qubit when an echoed dark mode excitation pulse sequence is applied in accordance with one or more embodiments described herein.

Again, the inventors constructed the two-junction transmon qubit 102, the two-junction transmon qubit 104, the two-junction transmon qubit 902, the mode-selective coupler 126, and the mode-selective coupler 914. Moreover, the inventors applied a non-limiting embodiment of the echoed dark mode excitation pulse sequence 1102 so as to entangle the two-junction transmon qubit 102 (e.g., control qubit) with the two-junction transmon qubit 104 (e.g., target qubit) and measured, via Ramsey experiments, the bright mode of the two-junction transmon qubit 104 (e.g., target qubit) when the two-junction transmon qubit 902 (e.g., spectator qubit) was encoded in its bright mode, the results of which are shown in the graph 1200. More specifically, the green curve represents the oscillatory behavior (e.g., Z oscillations) of the bright mode of the two-junction transmon qubit 104 (e.g., target qubit) in response to the echoed dark mode excitation pulse sequence 1102, when the two-junction transmon qubit 902 (e.g., spectator qubit) is initialized in a bright mode ground state. In contrast, the red curve represents the oscillatory behavior (e.g., Z oscillations) of the bright mode of the two-junction transmon qubit 104 (e.g., target qubit) in response to the echoed dark mode excitation pulse sequence 1102, when the two-junction transmon qubit 902 (e.g., spectator qubit) is initialized in a bright mode excited state. As can be seen, there is no significant difference between the green curve and the red curve (e.g., they are essentially on top of each other), indicating that the oscillatory response of the two-junction transmon qubit 104 (e.g., target qubit) can be made independent of the state of the two-junction transmon qubit 902 (e.g., spectator qubit) when the echoed dark mode excitation pulse sequence 1102 is implemented. In stark contrast and as explained above with respect to FIG. 10, the oscillatory response of the two-junction transmon qubit 104 (e.g., target qubit) is not independent of the state of the two-junction transmon qubit 902 (e.g., spectator qubit) when the dark mode excitation pulse sequence 602 is implemented. Accordingly, the echoed dark mode excitation pulse sequence 1102 can prevent spectator qubits from affecting target qubits.

FIG. 13 illustrates example, non-limiting graphs 1300 showing a spectator qubit's response to an echoed dark mode excitation pulse sequence in accordance with one or more embodiments described herein. In other words, while FIG. 12 shows that the echoed dark mode excitation pulse sequence 1102 can prevent spectator qubits from affecting target qubits, FIG. 13 shows that the echoed dark mode excitation pulse sequence 1102 can also prevent target qubits from affect spectator qubits.

First, consider the graph 1302. In various cases, the inventors constructed the two-junction transmon qubit 102, the two-junction transmon qubit 104, the two-junction transmon qubit 902, the mode-selective coupler 126, and the mode-selective coupler 914. Moreover, the inventors applied a non-limiting embodiment of the dark mode excitation pulse sequence 602 so as to entangle the two-junction transmon qubit 102 (e.g., control qubit) with the two-junction transmon qubit 104 (e.g., target qubit) and measured, via Ramsey experiments, the bright mode of the two-junction transmon qubit 902 (e.g., spectator qubit) when the two-junction transmon qubit 104 (e.g., target qubit) was encoded in its bright mode, the results of which are shown in the graph 1302. More specifically, the green curve represents the oscillatory behavior (e.g., Z oscillations) of the bright mode of the two-junction transmon qubit 902 (e.g., spectator qubit) in response to the dark mode excitation pulse sequence 602, when the two-junction transmon qubit 104 (e.g., target qubit) is initialized in a bright mode ground state. In contrast, the red curve represents the oscillatory behavior (e.g., Z oscillations) of the bright mode of the two-junction transmon qubit 902 (e.g., spectator qubit) in response to the dark mode excitation pulse sequence 602, when the two-junction transmon qubit 104 (e.g., target qubit) is initialized in a bright mode excited state. As can be seen, both the green curve and the red curve exhibit significant oscillatory behavior. In other words, the two-junction transmon qubit 902 (e.g., spectator qubit) can undergo state-dependent oscillations when the dark mode excitation pulse sequence 602 is implemented.

Now, consider the graph 1304. In various aspects, the inventors constructed the two-junction transmon qubit 102, the two-junction transmon qubit 104, the two-junction transmon qubit 902, the mode-selective coupler 126, and the mode-selective coupler 914. Moreover, the inventors applied a non-limiting embodiment of the echoed dark mode excitation pulse sequence 1102 so as to entangle the two-junction transmon qubit 102 (e.g., control qubit) with the two-junction transmon qubit 104 (e.g., target qubit) and measured, via Ramsey experiments, the bright mode of the two-junction transmon qubit 902 (e.g., spectator qubit) when the two-junction transmon qubit 104 (e.g., target qubit) was encoded in its bright mode, the results of which are shown in the graph 1304. More specifically, the green curve represents the oscillatory behavior (e.g., Z oscillations) of the bright mode of the two-junction transmon qubit 902 (e.g., spectator qubit) in response to the echoed dark mode excitation pulse sequence 1102, when the two-junction transmon qubit 104 (e.g., target qubit) is initialized in a bright mode ground state. In contrast, the red curve represents the oscillatory behavior (e.g., Z oscillations) of the bright mode of the two-junction transmon qubit 902 (e.g., spectator qubit) in response to the echoed dark mode excitation pulse sequence 1102, when the two-junction transmon qubit 104 (e.g., target qubit) is initialized in a bright mode excited state. As can be seen, neither the green curve nor the red curve exhibit significant oscillatory behavior. In other words, the two-junction transmon qubit 902 (e.g., spectator qubit) can refrain from undergoing state-dependent oscillations when the echoed dark mode excitation pulse sequence 1102 is implemented. Those having ordinary skill in the art will appreciate that the graph 1304 empirically demonstrates that the echoed dark mode excitation pulse sequence 1102 effectively isolates spectator qubits.

Although the herein disclosure thus far has described various embodiments of the invention as pertaining to two-junction transmon qubits, these are mere non-limiting examples. Those having ordinary skill in the art will appreciate that the herein teachings for facilitating entanglement via driving of dark modes can be applied to any suitable multi-mode qubits whose dark modes are coupled, where a two-junction transmon qubit is merely one non-limiting example of a multi-mode qubit.

Figure 14:
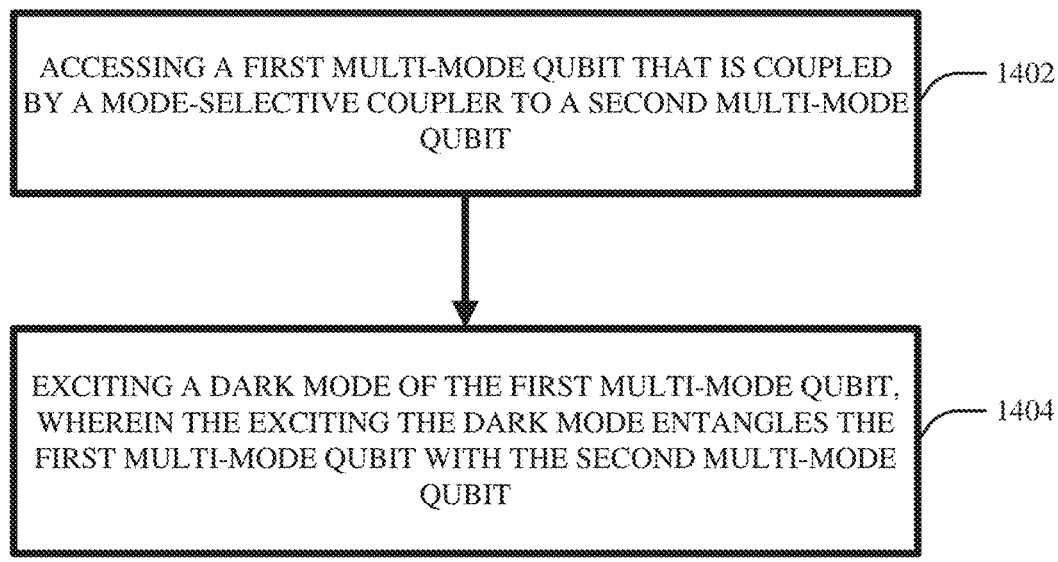
FIGS. 14-15 illustrate flow diagrams of example, non-limiting methods for facilitating entanglement via driving dark modes in accordance with one or more embodiments described herein.
Figure 15:
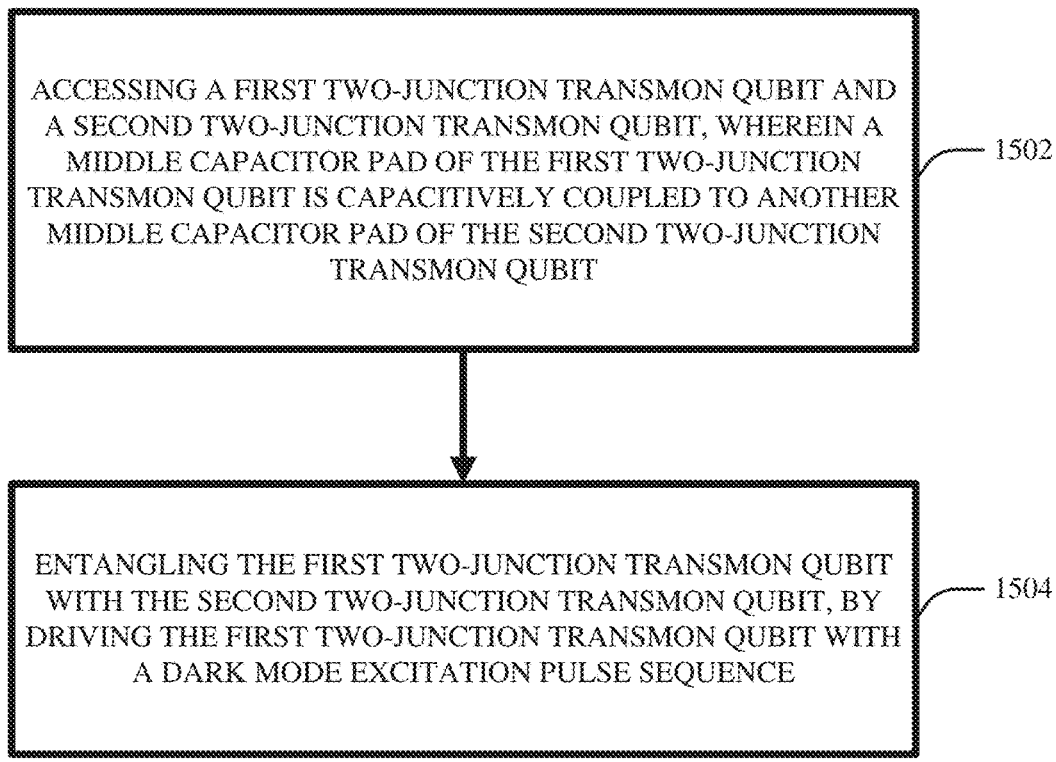

FIGS. 14-15 illustrate flow diagrams of example, non-limiting methods 1400-1500 for facilitating entanglement via driving dark modes in accordance with one or more embodiments described First consider the method 1400. In various embodiments, act 1402 can include accessing a first multi-mode qubit (e.g., 102) that is coupled by a mode-selective coupler (e.g., 126) to a second multi-mode qubit (e.g., 104).

In various aspects, act 1404 can include exciting (e.g., via 602 and/or 1102) a dark mode of the first multi-mode qubit, wherein the exciting the dark mode entangles the first multi-mode qubit with the second multi-mode qubit.

Although not explicitly shown in FIG. 14, the exciting the dark mode of the first multi-mode qubit can comprise: applying a pi-pulse (e.g., 604 and/or 1104) to the first multi-mode qubit; idling for a predetermined time period (e.g., 606 and/or 1106) after the applying the pi-pulse; and applying a negative pi-pulse (e.g., 608 and/or 1108) to the first multi-mode qubit based on the predetermined time period elapsing.

Although not explicitly shown in FIG. 14, the mode-selective coupler can couple the dark mode of the first multi-mode qubit to another dark mode of the second multi-mode qubit, and the mode-selective coupler can leave a bright mode of the first multi-mode qubit uncoupled from another bright mode of the second multi-mode qubit. In various cases, the first multi-mode qubit and the second multi-mode qubit can be two-junction transmon qubits. In various aspects, the mode-selective coupler can be a capacitor (e.g., 128) that directly couples a middle capacitor pad (e.g., 206) of the first multi-mode qubit to another middle capacitor pad (e.g., 212) of the second multi-mode qubit. In various other aspects, the mode-selective coupler can be a bus resonator (e.g., 302 and/or 402) that capacitively couples a middle capacitor pad (e.g., 206) of the first multi-mode qubit to another middle capacitor pad (e.g., 212) of the second multi-mode qubit.

Although not explicitly shown in FIG. 14, the exciting the dark mode of the first multi-mode qubit can further comprise: applying an echo pi-pulse (e.g., 1110) to a third multi-mode qubit (e.g., 902) that is coupled to the first multi-mode qubit.

Now consider the method 1500. In various embodiments, act 1502 can include accessing a first two-junction transmon qubit (e.g., 102) and a second two-junction transmon qubit (e.g., 104), wherein a middle capacitor pad (e.g., 206) of the first two-junction transmon qubit is capacitively coupled (e.g., via 126) to another middle capacitor pad (e.g., 212) of the second two-junction transmon qubit.

In various aspects, act 1504 can include entangling the first two-junction transmon qubit with the second two-junction transmon qubit, by driving the first two-junction transmon qubit with a dark mode excitation pulse sequence (e.g., 602 and/or 1102).

Although not explicitly shown in FIG. 15, the middle capacitor pad of the first two-junction transmon qubit being capacitively coupled to the another middle capacitor pad of the second two-junction transmon qubit can cause the dark mode of the first two-junction transmon qubit to be coupled to another dark mode of the second two-junction transmon qubit, and the middle capacitor pad of the first two-junction transmon qubit being capacitively coupled to the another middle capacitor pad of the second two-junction transmon qubit can cause a bright mode of the first two-junction transmon qubit to remain uncoupled from another bright mode of the second two-junction transmon qubit.

Although not explicitly shown in FIG. 15, the dark mode excitation pulse sequence can include a first pi-pulse (e.g., 604 and/or 1104), a first idle time (e.g., 606 and/or 1106), and a first negative pi-pulse (e.g., 608 and/or 1108).

Although not explicitly shown in FIG. 15, the dark mode excitation pulse sequence can further include a second pi-pulse (e.g., 1112), a second idle time (e.g., 1114), and a second negative pi-pulse (e.g., 1116), wherein the first negative pi-pulse and the second pi-pulse are separated by an echo pi-pulse (e.g., 1110) applied to a third two-junction transmon qubit (e.g., 902) that is coupled to the first two-junction transmon qubit.

Various embodiments described herein include techniques for generating entanglement between superconducting qubits without excessive energy consumption and without spatially-inefficient flux-tunable buses. Specifically, a control multi-mode qubit (e.g., 102) can be coupled to a target multi-mode qubit (e.g., 104) via a mode-selective coupler (e.g., 126). In various cases, the mode-selective coupler can cause dark modes of the multi-mode qubits to couple and can prevent bright modes of the multi-mode qubits from coupling. With such an architecture, a two-qubit entangling gate can be realized by applying a dark mode excitation pulse sequence (e.g., 602) that includes only single-qubit pulses. In particular, the dark mode excitation pulse sequence can include a pi-pulse applied to the control multi-mode qubit at the dark mode transition frequency of the control multi-mode qubit, an idle time during which no pulses are generated, and a negative pi-pulse applied to the control multi-mode qubit at the dark mode transition frequency of the control multi-mode qubit. As described herein, such a dark mode excitation pulse sequence can cause an entanglement response in the target multi-mode qubit. Moreover, the amplitude, phase, and/or idle time of the dark mode excitation pulse sequence can be controllably changed, so as to controllably change the type of entangling gate that is implemented by the dark mode excitation pulse sequence. In embodiments where one or more spectator multi-mode qubits (e.g., 902) are coupled to the control multi-mode qubit, an echoed dark mode excitation pulse sequence (e.g., 1102) can be used instead, so as to prevent unwanted entanglement with the one or more spectator qubits. As described herein, the echoed dark mode excitation pulse sequence can exhibit a similar structure to the dark mode excitation pulse sequence, but can further include one or more echo pi-pulses (e.g., 1110) that are respectively applied to the one or more spectator qubits so as to subtract out any unwanted entanglement effects. In any case, the dark mode excitation pulse sequence and/or the echoed dark mode excitation pulse sequence described herein can be implemented using an order of magnitude less energy as compared to existing techniques for facilitating entanglement. Furthermore, the dark mode excitation pulse sequence and/or the echoed dark mode excitation pulse sequence described herein can be implemented without relying upon spatially-inefficient flux-tunable buses. Accordingly, various embodiments described herein certainly constitute a concrete and tangible technical improvement in the field of superconducting qubits.

Those having ordinary skill in the art will appreciate that the herein disclosure describes non-limiting examples of various embodiments of the subject innovation. For ease of description and/or explanation, various portions of the herein disclosure utilize the term "each" when discussing various embodiments of the subject innovation. Those having ordinary skill in the art will appreciate that such usages of the term "each" are non-limiting examples. In other words, when the herein disclosure provides a description that is applied to "each" of some particular computerized object and/or component, it should be understood that this is a non-limiting example of various embodiments of the subject innovation, and it should be further understood that, in various other embodiments of the subject innovation, it can be the case that such description applies to fewer than "each" of that particular computerized object.

Figure 16:
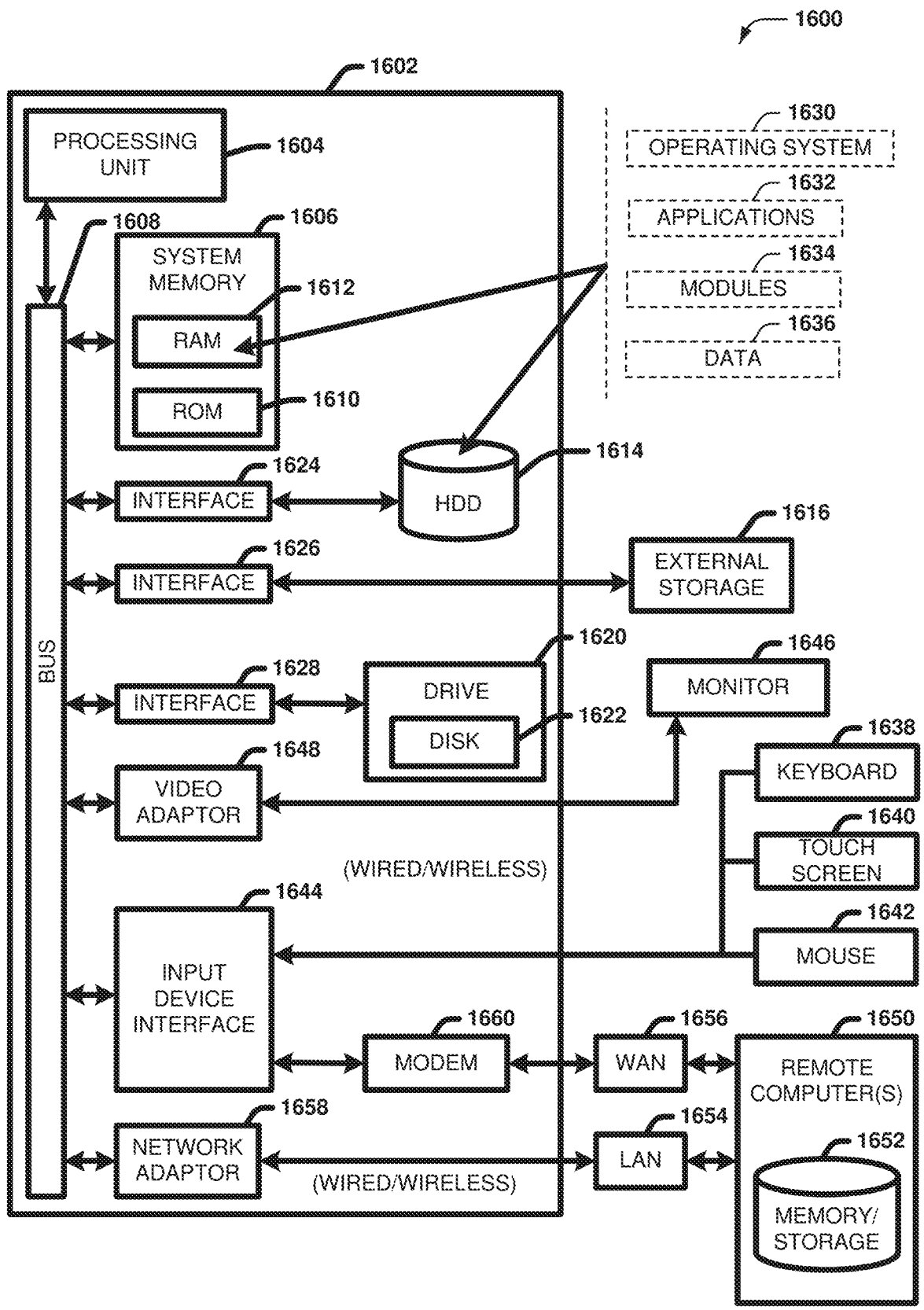
FIG. 16 illustrates a block diagram of an example, non-limiting operating environment in which one or more embodiments described herein can be facilitated.

In order to provide additional context for various embodiments described herein, FIG. 16 and the following discussion are intended to provide a brief, general description of a suitable computing environment 1600 in which the various embodiments of the embodiment described herein can be implemented. While the embodiments have been described above in the general context of computer-executable instructions that can run on one or more computers, those skilled in the art will recognize that the embodiments can be also implemented in combination with other program modules and/or as a combination of hardware and software.

Generally, program modules include routines, programs, components, data structures, etc., that perform particular tasks or implement particular abstract data types. Moreover, those skilled in the art will appreciate that the inventive methods can be practiced with other computer system configurations, including single-processor or multiprocessor computer systems, minicomputers, mainframe computers, Internet of Things (IoT) devices, distributed computing systems, as well as personal computers, hand-held computing devices, microprocessor-based or programmable consumer electronics, and the like, each of which can be operatively coupled to one or more associated devices.

The illustrated embodiments of the embodiments herein can be also practiced in distributed computing environments where certain tasks are performed by remote processing devices that are linked through a communications network. In a distributed computing environment, program modules can be located in both local and remote memory storage devices.

Computing devices typically include a variety of media, which can include computer-readable storage media, machine-readable storage media, and/or communications media, which two terms are used herein differently from one another as follows. Computer-readable storage media or machine-readable storage media can be any available storage media that can be accessed by the computer and includes both volatile and nonvolatile media, removable and non-removable media. By way of example, and not limitation, computer-readable storage media or machine-readable storage media can be implemented in connection with any method or technology for storage of information such as computer-readable or machine-readable instructions, program modules, structured data or unstructured data.

Computer-readable storage media can include, but are not limited to, random access memory (RAM), read only memory (ROM), electrically erasable programmable read only memory (EEPROM), flash memory or other memory technology, compact disk read only memory (CD ROM), digital versatile disk (DVD), Blu-ray disc (BD) or other optical disk storage, magnetic cassettes, magnetic tape, magnetic disk storage or other magnetic storage devices, solid state drives or other solid state storage devices, or other tangible and/or non-transitory media which can be used to store desired information. In this regard, the terms "tangible" or "non-transitory" herein as applied to storage, memory or computer-readable media, are to be understood to exclude only propagating transitory signals per se as modifiers and do not relinquish rights to all standard storage, memory or computer-readable media that are not only propagating transitory signals per se.

Computer-readable storage media can be accessed by one or more local or remote computing devices, e.g., via access requests, queries or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, RF, infrared and other wireless media.

With reference again to FIG. 16, the example environment 1600 for implementing various embodiments of the aspects described herein includes a computer 1602, the computer 1602 including a processing unit 1604, a system memory 1606 and a system bus 1608. The system bus 1608 couples system components including, but not limited to, the system memory 1606 to the processing unit 1604. The processing unit 1604 can be any of various commercially available processors. Dual microprocessors and other multi processor architectures can also be employed as the processing unit 1604.

The system bus 1608 can be any of several types of bus structure that can further interconnect to a memory bus (with or without a memory controller), a peripheral bus, and a local bus using any of a variety of commercially available bus architectures. The system memory 1606 includes ROM 1610 and RAM 1612. A basic input/output system (BIOS) can be stored in a non-volatile memory such as ROM, erasable programmable read only memory (EPROM), EEPROM, which BIOS contains the basic routines that help to transfer information between elements within the computer 1602, such as during startup. The RAM 1612 can also include a high-speed RAM such as static RAM for caching data.

The computer 1602 further includes an internal hard disk drive (HDD) 1614 (e.g., EIDE, SATA), one or more external storage devices 1616 (e.g., a magnetic floppy disk drive (FDD) 1616, a memory stick or flash drive reader, a memory card reader, etc.) and a drive 1620, e.g., such as a solid state drive, an optical disk drive, which can read or write from a disk 1622, such as a CD-ROM disc, a DVD, a BD, etc. Alternatively, where a solid state drive is involved, disk 1622 would not be included, unless separate. While the internal HDD 1614 is illustrated as located within the computer 1602, the internal HDD 1614 can also be configured for external use in a suitable chassis (not shown). Additionally, while not shown in environment 1600, a solid state drive (SSD) could be used in addition to, or in place of, an HDD 1614. The HDD 1614, external storage device(s) 1616 and drive 1620 can be connected to the system bus 1608 by an HDD interface 1624, an external storage interface 1626 and a drive interface 1628, respectively. The interface 1624 for external drive implementations can include at least one or both of Universal Serial Bus (USB) and Institute of Electrical and Electronics Engineers (IEEE) 1394 interface technologies. Other external drive connection technologies are within contemplation of the embodiments described herein.

The drives and their associated computer-readable storage media provide nonvolatile storage of data, data structures, computer-executable instructions, and so forth. For the computer 1602, the drives and storage media accommodate the storage of any data in a suitable digital format. Although the description of computer-readable storage media above refers to respective types of storage devices, it should be appreciated by those skilled in the art that other types of storage media which are readable by a computer, whether presently existing or developed in the future, could also be used in the example operating environment, and further, that any such storage media can contain computer-executable instructions for performing the methods described herein.

A number of program modules can be stored in the drives and RAM 1612, including an operating system 1630, one or more application programs 1632, other program modules 1634 and program data 1636. All or portions of the operating system, applications, modules, and/or data can also be cached in the RAM 1612. The systems and methods described herein can be implemented utilizing various commercially available operating systems or combinations of operating systems.

Computer 1602 can optionally comprise emulation technologies. For example, a hypervisor (not shown) or other intermediary can emulate a hardware environment for operating system 1630, and the emulated hardware can optionally be different from the hardware illustrated in FIG. 16. In such an embodiment, operating system 1630 can comprise one virtual machine (VM) of multiple VMs hosted at computer 1602. Furthermore, operating system 1630 can provide runtime environments, such as the Java runtime environment or the .NET framework, for applications 1632. Runtime environments are consistent execution environments that allow applications 1632 to run on any operating system that includes the runtime environment. Similarly, operating system 1630 can support containers, and applications 1632 can be in the form of containers, which are lightweight, standalone, executable packages of software that include, e.g., code, runtime, system tools, system libraries and settings for an application.

Further, computer 1602 can be enable with a security module, such as a trusted processing module (TPM). For instance with a TPM, boot components hash next in time boot components, and wait for a match of results to secured values, before loading a next boot component. This process can take place at any layer in the code execution stack of computer 1602, e.g., applied at the application execution level or at the operating system (OS) kernel level, thereby enabling security at any level of code execution.

A user can enter commands and information into the computer 1602 through one or more wired/wireless input devices, e.g., a keyboard 1638, a touch screen 1640, and a pointing device, such as a mouse 1642. Other input devices (not shown) can include a microphone, an infrared (IR) remote control, a radio frequency (RF) remote control, or other remote control, a joystick, a virtual reality controller and/or virtual reality headset, a game pad, a stylus pen, an image input device, e.g., camera(s), a gesture sensor input device, a vision movement sensor input device, an emotion or facial detection device, a biometric input device, e.g., fingerprint or iris scanner, or the like. These and other input devices are often connected to the processing unit 1604 through an input device interface 1644 that can be coupled to the system bus 1608, but can be connected by other interfaces, such as a parallel port, an IEEE 1394 serial port, a game port, a USB port, an IR interface, a BLUETOOTH® interface, etc.

A monitor 1646 or other type of display device can be also connected to the system bus 1608 via an interface, such as a video adapter 1648. In addition to the monitor 1646, a computer typically includes other peripheral output devices (not shown), such as speakers, printers, etc.

The computer 1602 can operate in a networked environment using logical connections via wired and/or wireless communications to one or more remote computers, such as a remote computer(s) 1650. The remote computer(s) 1650 can be a workstation, a server computer, a router, a personal computer, portable computer, microprocessor-based entertainment appliance, a peer device or other common network node, and typically includes many or all of the elements described relative to the computer 1602, although, for purposes of brevity, only a memory/storage device 1652 is illustrated. The logical connections depicted include wired/wireless connectivity to a local area network (LAN) 1654 and/or larger networks, e.g., a wide area network (WAN) 1656. Such LAN and WAN networking environments are commonplace in offices and companies, and facilitate enterprise-wide computer networks, such as intranets, all of which can connect to a global communications network, e.g., the Internet.

When used in a LAN networking environment, the computer 1602 can be connected to the local network 1654 through a wired and/or wireless communication network interface or adapter 1658. The adapter 1658 can facilitate wired or wireless communication to the LAN 1654, which can also include a wireless access point (AP) disposed thereon for communicating with the adapter 1658 in a wireless mode.

When used in a WAN networking environment, the computer 1602 can include a modem 1660 or can be connected to a communications server on the WAN 1656 via other means for establishing communications over the WAN 1656, such as by way of the Internet. The modem 1660, which can be internal or external and a wired or wireless device, can be connected to the system bus 1608 via the input device interface 1644. In a networked environment, program modules depicted relative to the computer 1602 or portions thereof, can be stored in the remote memory/storage device 1652. It will be appreciated that the network connections shown are example and other means of establishing a communications link between the computers can be used.

When used in either a LAN or WAN networking environment, the computer 1602 can access cloud storage systems or other network-based storage systems in addition to, or in place of, external storage devices 1616 as described above, such as but not limited to a network virtual machine providing one or more aspects of storage or processing of information. Generally, a connection between the computer 1602 and a cloud storage system can be established over a LAN 1654 or WAN 1656 e.g., by the adapter 1658 or modem 1660, respectively. Upon connecting the computer 1602 to an associated cloud storage system, the external storage interface 1626 can, with the aid of the adapter 1658 and/or modem 1660, manage storage provided by the cloud storage system as it would other types of external storage. For instance, the external storage interface 1626 can be configured to provide access to cloud storage sources as if those sources were physically connected to the computer 1602.

The computer 1602 can be operable to communicate with any wireless devices or entities operatively disposed in wireless communication, e.g., a printer, scanner, desktop and/or portable computer, portable data assistant, communications satellite, any piece of equipment or location associated with a wirelessly detectable tag (e.g., a kiosk, news stand, store shelf, etc.), and telephone. This can include Wireless Fidelity (Wi-Fi) and BLUETOOTH® wireless technologies. Thus, the communication can be a predefined structure as with a conventional network or simply an ad hoc communication between at least two devices.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adaptor card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowcharts and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments in which tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or non-volatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:
    accessing a first multi-mode qubit that is coupled by a mode-selective coupler to a second multi-mode qubit; and
    exciting a dark mode of the first multi-mode qubit, wherein the exciting the dark mode entangles the first multi-mode qubit with the second multi-mode qubit.

2. The method of claim 1, wherein the exciting the dark mode of the first multi-mode qubit comprises:
    applying a pi-pulse to the first multi-mode qubit.

3. The method of claim 2, wherein the exciting the dark mode of the first multi-mode qubit further comprises:
    idling for a predetermined time period after the applying the pi-pulse; and
    applying a negative pi-pulse to the first multi-mode qubit based on the predetermined time period elapsing.

4. The method of claim 3, wherein the mode-selective coupler couples the dark mode of the first multi-mode qubit to another dark mode of the second multi-mode qubit, and wherein the mode-selective coupler leaves a bright mode of the first multi-mode qubit uncoupled from another bright mode of the second multi-mode qubit.

5. The method of claim 4, wherein the first multi-mode qubit and the second multi-mode qubit are two-junction transmon qubits.

6. The method of claim 5, wherein the mode-selective coupler is a capacitor that directly couples a middle capacitor pad of the first multi-mode qubit to another middle capacitor pad of the second multi-mode qubit.

7. The method of claim 5, wherein the mode-selective coupler is a bus resonator that capacitively couples a middle capacitor pad of the first multi-mode qubit to another middle capacitor pad of the second multi-mode qubit.

8. The method of claim 3, further comprising:
    applying an echo pi-pulse to a third multi-mode qubit that is coupled to the first multi-mode qubit.

9. A device, comprising:
    a first multi-mode qubit and a second multi-mode qubit; and
    a mode-selective coupler that couples the first multi-mode qubit to the second multi-mode qubit, wherein the mode-selective coupler is configured to, upon excitation of a dark mode of the first multi-mode qubit, entangle the first multi-mode qubit with the second multi-mode qubit.

10. The device of claim 9, wherein the dark mode of the first multi-mode qubit is excited via application of a pi-pulse to the first multi-mode qubit.

11. The device of claim 10, wherein the dark mode of the first multi-mode qubit is de-excited via application of a negative pi-pulse to the first multi-mode qubit, and wherein the negative pi-pulse is applied after a predetermined time period has elapsed following the application of the pi-pulse.

12. The device of claim 11, wherein the mode-selective coupler couples the dark mode of the first multi-mode qubit to another dark mode of the second multi-mode qubit, and wherein the mode-selective coupler leaves a bright mode of the first multi-mode qubit uncoupled from another bright mode of the second multi-mode qubit.

13. The device of claim 12, wherein the first multi-mode qubit and the second multi-mode qubit are two-junction transmon qubits.

14. The device of claim 13, wherein the mode-selective coupler is a capacitor that directly couples a middle capacitor pad of the first multi-mode qubit to another middle capacitor pad of the second multi-mode qubit.

15. The device of claim 13, wherein the mode-selective coupler is a bus resonator that capacitively couples a middle capacitor pad of the first multi-mode qubit to another middle capacitor pad of the second multi-mode qubit.

16. The device of claim 11, further comprising:
    a third multi-mode qubit that is coupled to the first multi-mode qubit, wherein an echo pi-pulse is applied to the third multi-mode qubit.

17. A method, comprising:
- accessing a first two-junction transmon qubit and a second two-junction transmon qubit, wherein a middle capacitor pad of the first two-junction transmon qubit is capacitively coupled to another middle capacitor pad of the second two-junction transmon qubit; and
- entangling the first two-junction transmon qubit with the second two-junction transmon qubit, by driving the first two-junction transmon qubit with a dark mode excitation pulse sequence.

18. The method of claim 17, wherein the middle capacitor pad of the first two-junction transmon qubit being capacitively coupled to the another middle capacitor pad of the second two-junction transmon qubit causes the dark mode of the first two-junction transmon qubit to be coupled to another dark mode of the second two-junction transmon qubit, and wherein the middle capacitor pad of the first two-junction transmon qubit being capacitively coupled to the another middle capacitor pad of the second two-junction transmon qubit causes a bright mode of the first two-junction transmon qubit to remain uncoupled from another bright mode of the second two-junction transmon qubit.

19. The method of claim 17, wherein the dark mode excitation pulse sequence includes a first pi-pulse, a first idle time, and a first negative pi-pulse.

20. The method of claim 19, wherein the dark mode excitation pulse sequence further includes a second pi-pulse, a second idle time, and a second negative pi-pulse, wherein the first negative pi-pulse and the second pi-pulse are separated by an echo pi-pulse applied to a third two-junction transmon qubit that is coupled to the first two-junction transmon qubit.

* * * * *